United States Patent [19]
Watanabe et al.

[11] Patent Number: 5,580,420
[45] Date of Patent: Dec. 3, 1996

[54] PLASMA GENERATING METHOD AND APPARATUS AND PLASMA PROCESSING METHOD AND APPARATUS

[75] Inventors: Katsuya Watanabe, Kudamatsu; Tetsunori Kaji, Tokuyama; Naoyuki Tamura, Kudamatsu; Kenji Nakata, Hikari; Hiroyuki Shichida; Seiichi Watanabe, both of Kudamatsu; Sadayuki Okudaira, Oume; Keizo Suzuki, Kodaira, all of Japan

[73] Assignee: Hitachi, Ltd., Tokyo, Japan

[21] Appl. No.: 307,272

[22] Filed: Sep. 16, 1994

[30]  Foreign Application Priority Data

Sep. 17, 1993  [JP]  Japan ................................. 5-231274
Dec. 28, 1993  [JP]  Japan ................................. 5-334961
Jun. 13, 1994  [JP]  Japan ................................. 6-130125

[51] Int. Cl.$^6$ ................................................ H01L 21/00
[52] U.S. Cl. .................. 156/643.1; 156/345; 216/69; 216/70
[58] Field of Search .................... 156/643.1, 345 P; 216/67, 69, 70; 204/298.37, 298.38

[56] References Cited

U.S. PATENT DOCUMENTS

| | | | |
|---|---|---|---|
| 4,866,346 | 9/1989 | Gaudreau et al. | 216/69 X |
| 5,160,397 | 11/1992 | Doki et al. | 216/69 X |

FOREIGN PATENT DOCUMENTS

| | | | |
|---|---|---|---|
| 1-107538 | 4/1989 | Japan | 216/69 |
| 2-230728 | 9/1990 | Japan | 216/69 |
| 4-167424 | 6/1992 | Japan | . |

OTHER PUBLICATIONS

Microwave Plasma Etching System Sep. 1991 Japan.

*Primary Examiner*—William Powell
*Attorney, Agent, or Firm*—Bardehle, Pagenberg, Dost, Altenburg, Frohwitter, Geissler & Partners

[57] ABSTRACT

A microwave penetrating window and a cavity which are substantially equal in diameter to a plasma generating chamber are successively connected to the plasma generating chamber and microwaves are introduced via the cavity into the plasma generating chamber. A processing gas in the plasma generating chamber is converted into a plasma by means of the microwaves introduced into the plasma generating chamber and the microwaves in specific modes are resonated in between a microwave reflective interface with the plasma generated in the plasma generating chamber and the reflective edge face of the cavity. The microwaves in the specific modes are thus formed in the cavity and the energy of the microwaves in the specific modes is increased by resonance. The boosted energy is added to the plasma and the plasma is densified accordingly. Moreover, a plasma excellent in uniformity and stability can be generated by resonating the microwaves in the specific modes in the presence of a uniform electromagnetic field.

52 Claims, 9 Drawing Sheets

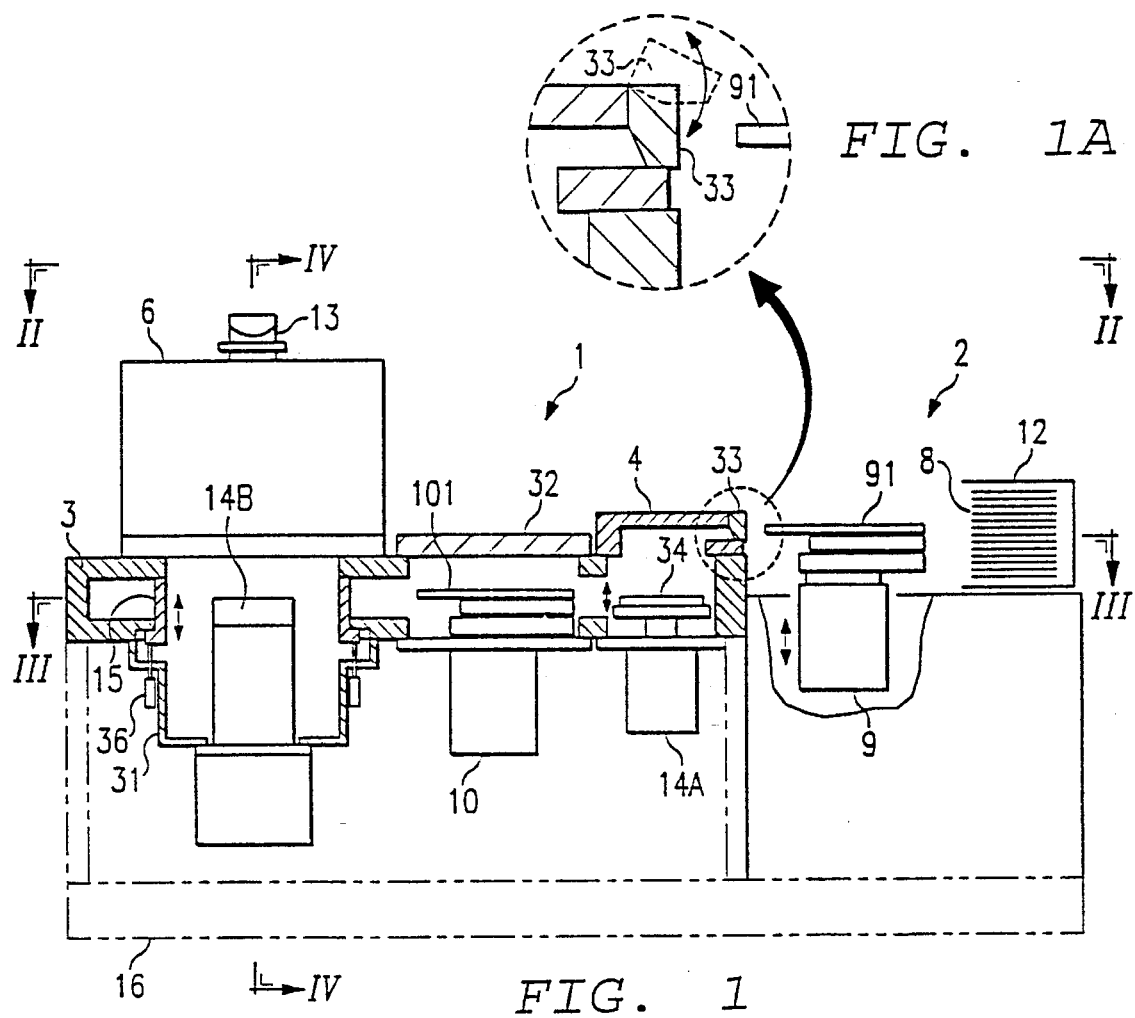
FIG. 1A
FIG. 1
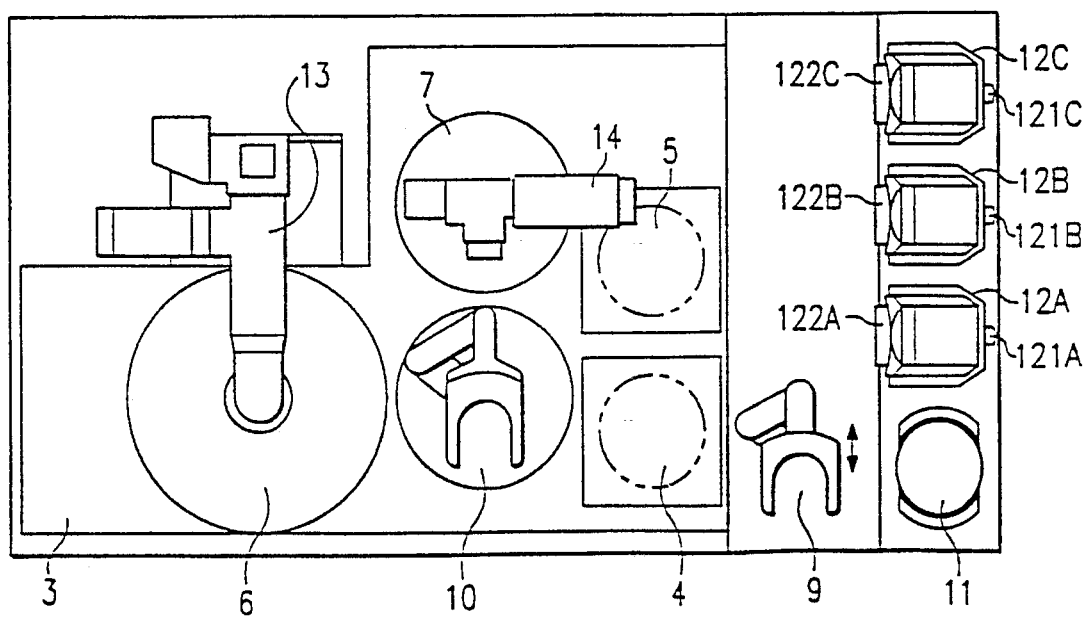
FIG. 2

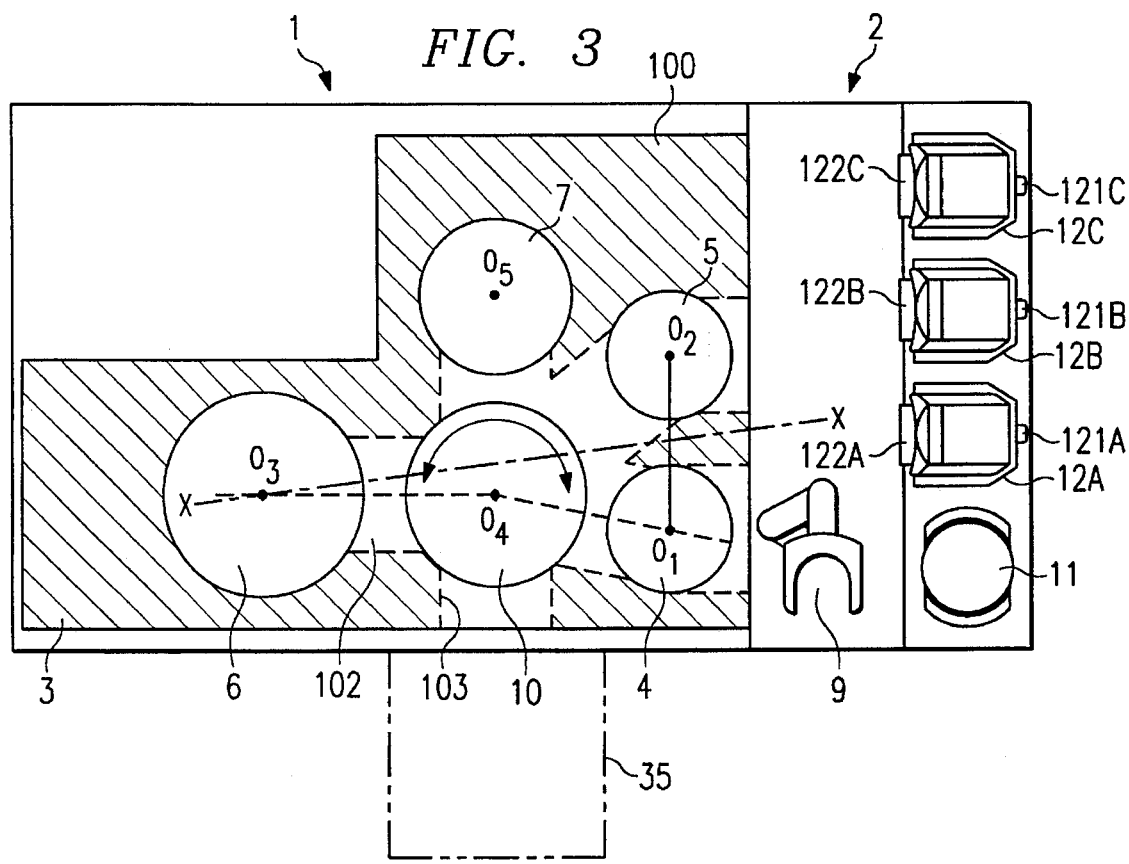
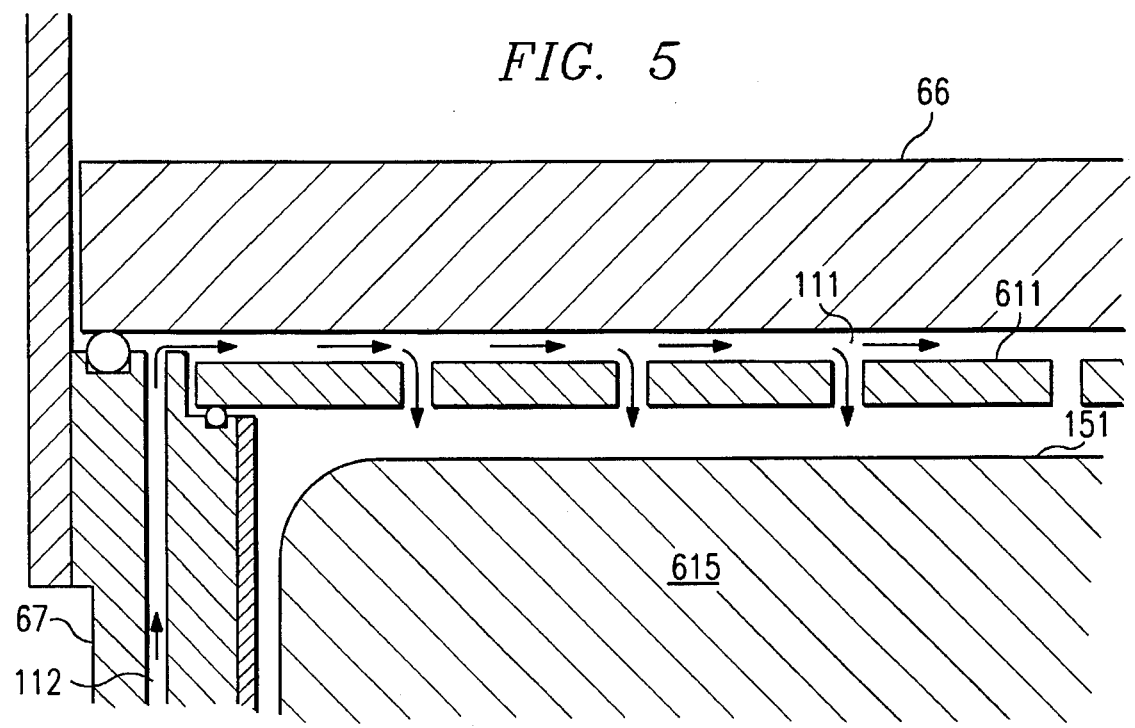

PLASMA GENERATING METHOD AND APPARATUS AND PLASMA PROCESSING METHOD AND APPARATUS

BACKGROUND OF THE INVENTION

The present invention relates to plasma generating methods and apparatus, and plasma processing methods and apparatus using the same. More particularly, the present invention relates to a plasma generating method and apparatus for use in generating a plasma by means of microwaves, and a plasma processing method and apparatus which uses the same and is used in processing specimens (for example, semiconductor elements by means of the plasma).

The generating of a plasma and processing specimens by means of the plasma has been mentioned in, for example, "Microwave Plasma Etching Apparatus," by Kanai et al., pp 23–28, No. 9, Vol. 73, Hitachi Review (1991). FIG. 16 shows such an apparatus as noted above in which a quartz bell-jar 24 as a semispheric quartz discharge tube is installed in a waveguide 22 for propagating microwaves and a plasma is generated in the quartz bell-jar 24 through the interaction between the external magnetic field of solenoid coils 23 and the electric field of the microwaves from a magnetron 21. The plasma thus generated is utilized to process a wafer 5 as a workpiece loaded on a specimen stage 26 in a processing chamber. In this case, reference numeral 27 denotes a radio-frequency power source for applying an RF bias voltage to the specimen stage 26 at the time of etching; an etching gas 28 to be introduced into the quartz bell-jar 24; and an exhaust gas 29.

Such specimen processing devices generate a non-uniform and unstable plasma which limit the narrowness of lines which can be etched. For example, in the process of manufacturing semiconductors using a plasma, the specimen loaded on a specimen stage needs processing uniformly without being electrically damaged. However, the aforementioned prior art has been unsatisfactory to gain plasma performance corresponding to a future demand for diameter-enlargement and densification, that is, to gain a high-density uniform plasma.

The prior art microwave plasma etching apparatus has been so constructed as to generate the plasma in the semi-spheric quartz bell-jar installed as a microwave penetrating member in the waveguide. For this reason, the tendency is for the microwaves propagated in the waveguide to be easily affected by the quartz bell-jar. As microwaves in a plurality of modes can be present in a large-diameter waveguide, they are caused by the semispheric quartz bell-jar and the plasma generated therein to repeat complicated reflection and refraction in the waveguide before being absorbed by the plasma in the quartz bell-jar. As a result, the microwaves are excited into varieties of modes when an apparatus corresponding to a specimen having a diameter of not less than 8 inches is set up. Therefore, the microwave undergoes a mode-to-mode transition in time because the plasma thus generated becomes unstable and the state of the plasma varies with time. As the state of the plasma varies with time, its impedance also varies and this makes it hardly possible to generate high-density plasma since microwave energy cannot be transmitted to the plasma with efficiency and to generate uniform plasma in a wide range corresponding to such a large-diameter specimen.

Accordingly, it is an object of the present invention to provide a plasma generating method and apparatus for generating a high-density uniform plasma by means of microwaves. A second object of the present invention is to provide a plasma generating method and apparatus for generating a high-density plasma by means of microwaves. A third object of the present invention is to provide a plasma generating method and apparatus for generating a stable uniform plasma by means of microwaves. A fourth object of the present invention is to provide a plasma processing method and apparatus capable of dealing with specimens having a diameter of not less than 8 inches and of improving the processing rate and uniformity in processing specimens.

SUMMARY OF THE INVENTION

To accomplish the above objectives, various embodiments of the present invention are provided in which the microwaves are made resonant to increase the uniformity and stability of the plasma. For example, according to one embodiment of the present invention, there is provided a plasma etching apparatus and process in which a specimen is processed through the steps of:

providing a cylindrical cavity resonator adjacent to a plasma reaction chamber, introducing microwaves into the cylindrical cavity resonator, causing resonance in specific modes of the microwaves in the cylindrical cavity resonator, and causing the plasma to be generated in the plasma reaction chamber by making the magnetic field act on the microwave electric field.

According to one aspect of the just-described embodiment, a flat, plate-like microwave radiation window for use as a microwave penetrating member is provided, having a diameter equal to the inner diameter of the plasma reaction chamber. Such a window is provided in between a part of the cylindrical cavity resonator and the plasma reaction chamber, so that the plasma is generated in the plasma reaction chamber.

High energy density microwaves in specific modes obtained by the cylindrical cavity resonator are introduced via the microwave radiation window into the plasma reaction chamber, and thus a high-density uniform plasma is obtained.

Microwave energy loss in the cylindrical cavity resonator is unavoidable if only part of the microwaves resonated in the cylindrical cavity resonator are introduced into the plasma reaction chamber, and, therefore, the microwave energy transmission efficiency would be reduced and a higher-density plasma would not be obtained. Further, if the apparatus is intended to deal with a specimen having a diameter of not less than 8," the cylindrical cavity resonator tends to become greater in size, and so does the apparatus itself. Therefore, according to a further embodiment of the present invention, there is provided the further step of introducing some of the microwaves having a high energy density in the specific modes into the plasma reaction chamber from a microwave radiation window in the form of a flat quartz plate having a diameter substantially the same as the inner diameter of the plasma reaction chamber. Keeping the diameter of the resonance chamber and the plasma chamber substantially the same increases the amount of energy transfer efficiency into the plasma, as well as increasing the size of the wafer which can be handled, in comparison to embodiments in which the resonance chamber has a diameter significantly larger than that of the reaction chamber.

According to still a further embodiment of the present invention, there is provided, an apparatus comprising: a microwave penetrating window which has a diameter substantially equal to the inner diameter of a plasma generating chamber and is provided in the microwave introducing member of the plasma generating chamber, and a cavity which has a diameter substantially equal to the inner diameter of the plasma generating chamber and is for use in resonating microwaves in specific modes on a microwave reflective interface with the plasma generated in the plasma generating chamber and is set adjacent to the plasma generating chamber via the microwave penetrating window; wherein the microwave reflective interface has a diameter substantially equal to that of the cavity and the reflective edge face of the cavity.

According to an even further embodiment of the invention, the microwaves introduced via the cavity into the plasma generating chamber cause the plasma to be generated in the plasma generating chamber. As the generation of the plasma takes place, the microwaves from the cavity without being absorbed by the plasma are reflected from the microwave reflective interface with the plasma. The microwave thus reflected is again reflected from the reflective edge face of the cavity and becomes a standing wave, which undergoes the repetition of reflection between the microwave reflective interface with the plasma and the reflective edge face of the cavity and which is superimposed on a newly-incident microwave. The resonance state is thus created, whereby microwaves in the specific modes are formed in the cavity and the high energy of the microwaves in the specific modes is applied to the plasma so as to densify the plasma.

According to this embodiment, since the cavity is set substantially equal in diameter to the discharge space, the microwaves are resonated on the whole, substantially equivalent cavity-to-plasma reflective surface, and the microwaves in the specific modes transmitted directly to the plasma. Consequently, a plasma excellent in uniformity is generated with stability by resonating the microwaves in the specific modes simultaneously in the presence of a uniform electromagnetic field.

According to still a further embodiment of the invention, there is provided an apparatus comprising: a cavity for forming a microwave reflective space, wherein the microwave reflected from a microwave reflective interface with a plasma becomes a standing wave, and wherein the cavity is coupled to the microwave introducing side of a plasma generating member where the microwave is introduced.

Methods performed by such embodiments include transmitting the energy of the microwaves to the plasma by causing the microwave transmitted to the cavity to generate a standing wave in between the microwave reflective interface with the plasma generated in the plasma generating member and the opposite-to-plasma edge face of the cavity.

The microwaves introduced via the cavity into the plasma generating member cause the plasma to be generated in the plasma generating member. As the generation of the plasma takes place, the microwaves from the cavity without being absorbed by the plasma are reflected from the microwave reflective interface with the plasma. The microwave thus reflected is again reflected from the reflective edge face of the cavity and becomes the standing wave, which undergoes the repetition of reflection in between the microwave reflective interface with the plasma and the reflective edge face of the cavity and which is superimposed on a newly-incident microwave. The resonance state is thus created, whereby the high energy of the microwaves is applied to the plasma so as to densify the plasma.

According to still a further embodiment, there is provided an apparatus comprising: a cavity for forming a microwave reflective space, wherein the microwaves reflected from a microwave reflective interface with a plasma become those in specific modes, and wherein their reflection is repeated and installed on the microwave introducing side of a plasma generating member where the microwave is introduced.

Methods performed by such embodiments include transmitting the microwaves in the specific modes directly to the plasma by causing the microwaves transmitted to the cavity to repeat reflection in between the microwave reflective interface with the plasma generated in the plasma generating member and the opposite-to-plasma edge face of the cavity provided on the microwave introducing side of the plasma generating member.

The microwaves introduced via the cavity into the plasma generating member cause the plasma to be generated in the plasma generating member. As the generation of the plasma takes place, the microwaves from the cavity, without being absorbed by the plasma, are reflected from the microwave reflective interface with the plasma. The microwave thus reflected is again reflected from the reflective edge face of the cavity and becomes a standing wave, which undergoes the repetition of reflection in between the microwave reflective interface with the plasma and the reflective edge face of the cavity. The resonance state is thus created, whereby the microwaves in the specific modes are formed in the cavity. Since the microwaves in the specific modes are directly transmitted to the plasma, a plasma excellent in uniformity is generated with stability by making the microwaves in the specific modes have an electromagnetic field excellent in uniformity.

According to still another embodiment, there is provided an apparatus comprising: a waveguide for propagating microwaves generated from a microwave oscillator fitted to one end of the waveguide, a cylindrical cavity whose one enlarged edge face is coupled to the other end of the waveguide, a cylindrical plasma generating chamber having a diameter substantially equal to that of the cylindrical cavity coupled to the other open end of the cylindrical cavity, a flat, platelike, microwave penetrating window which has a diameter substantially equal to the diameters of the cylindrical cavity and the plasma generating chamber, and which is provided at the joint between the cylindrical cavity and the plasma generating chamber, a specimen stage provided in the plasma generating chamber in such a way as to face the microwave penetrating window, processing gas supply means for supplying a processing gas to the vicinity of the microwave penetrating window in the direction of the plasma generating chamber, and vacuum extraction means for vacuumizing the plasma generating chamber.

Methods performed by such embodiments include: supplying the processing gas to the plasma generating chamber and vacuumizing the plasma generating chamber up to a predetermined pressure level, introducing the microwaves thus oscillated into the cylindrical cavity, introducing the microwaves propagating through the cylindrical cavity directly into the plasma generating chamber, converting the processing gas in the plasma generating chamber to a plasma by means of the microwaves introduced into the plasma generating chamber, resonating the microwaves that have not been absorbed by the plasma in specific modes in between the plasma generated in the plasma generating chamber and the other edge face of the cylindrical cavity opposite to the plasma generating chamber, and processing a specimen by means of the plasma in the plasma generating chamber.

The processing gas in the plasma generating chamber is converted into the plasma by means of the microwaves introduced from the cylindrical cavity into the plasma generating chamber. Since the cylindrical cavity, the microwave penetrating window and the cylindrical plasma generating chamber are set to have substantially the same diameter, the microwaves from the cylindrical cavity which have not been absorbed by the plasma as the generation of the plasma takes place are reflected from the microwave reflective interface with the plasma and those reflected therefrom are again reflected from the other edge face of the cylindrical cavity. The microwave becomes a standing wave in the specific mode and undergoes the repetition of reflection in between the microwave reflective interface with the plasma and the edge face of the cylindrical cavity and is superimposed on a newly-incident microwave. The resonance state is thus created, whereby the microwaves in the specific modes are formed in the cylindrical cavity and the high energy of the microwaves in the specific modes is transmitted to the plasma so as to densify the plasma. As the densification of the plasma progresses, further, the number of ions and reactive species in the plasma increases, thus improving the rate of processing specimens. Since the cylindrical cavity is set substantially equal in diameter to the plasma generating chamber, the energy of the microwaves thus resonated is transmitted in the specific modes directly to the plasma which conforms to the mode configuration. Therefore, a plasma excellent in uniformity is generated with stability, which results in improving the uniform processing of specimens.

BRIEF DESCRIPTION OF THE DRAWINGS

For a more complete understanding of the present invention and for further advantages thereof, reference is made to the following Detailed Description taken in conjunction with the accompanying drawings, in which:

FIG. 1 is a vertical sectional view of a vacuum processing apparatus which is loaded with a plasma processing apparatus embodying the present invention.

FIG. 1A is an enlarged view of the indicated portion of FIG. 1.

FIG. 2 is a block diagram taken on plane II—II of FIG. 1.

FIG. 3 is a plan sectional view taken on line III—III of FIG. 1.

FIG. 5 is a detail view of the gas introducing member of the apparatus of FIG. 4.

Figure 4:
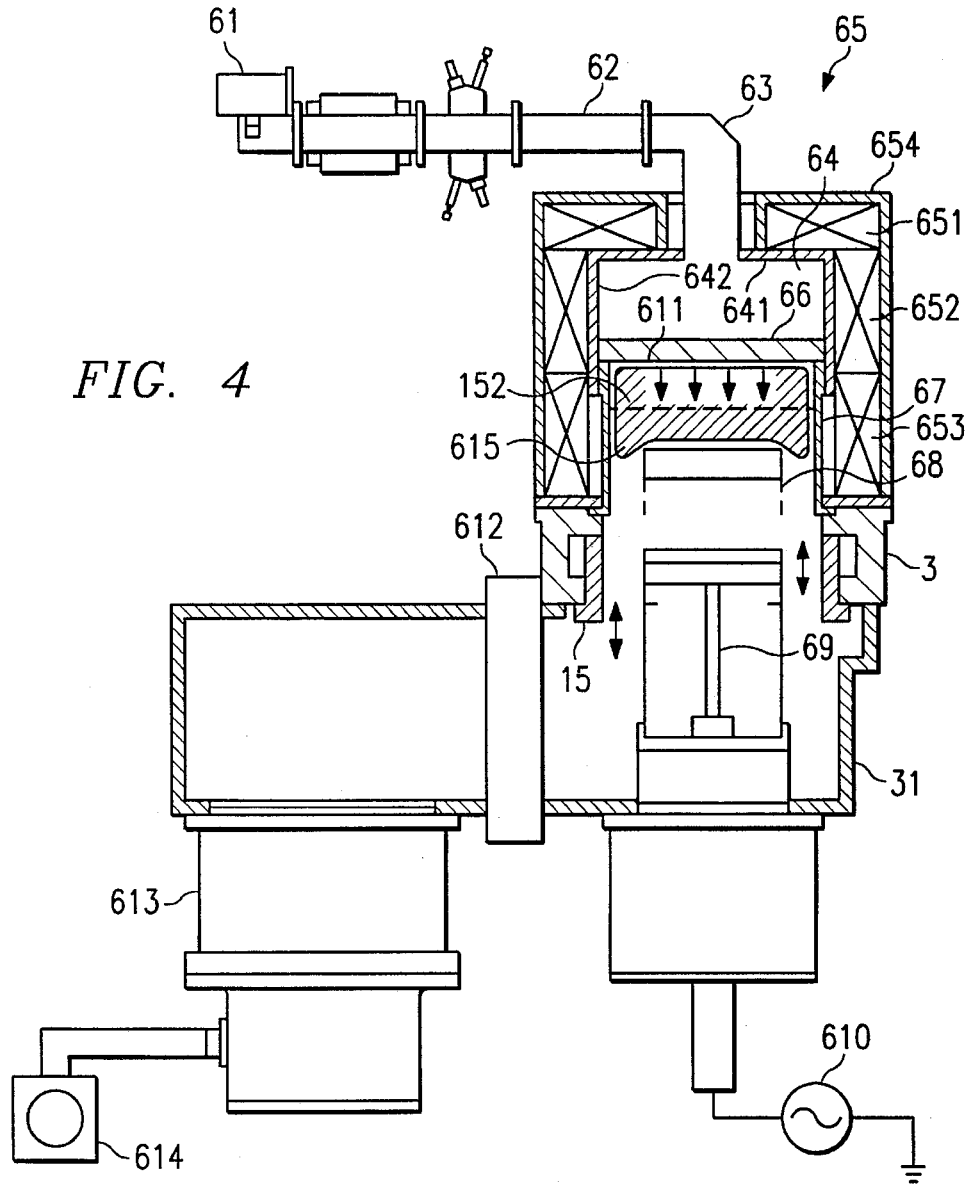
FIG. 4 is a vertical sectional view taken on line IV—IV of FIG. 1 and illustrates the plasma processing apparatus in vertical cross section according to the present invention.

It is to be noted, however, that the appended drawings illustrate only typical embodiments of this invention and are therefore not to be considered limiting of its scope, for the invention may admit to other equally effective embodiments.

DESCRIPTION OF EMBODIMENTS OF THE INVENTION

Referring to FIGS. 1 through 6 inclusive, an embodiment of the present invention will be described.

A vacuum processing apparatus comprises an integral frame 16, a rectangular vacuum processing unit 1 and a loader 2 which are fitted to the frame 16. The loader 2 includes a table for placing a cassette 12 in position, a wafer orientation flat mate 11 and an atmospheric conveyor robot 9. The vacuum processing unit 1 includes a buffer chamber 3, a load lock chamber 4, an unload lock chamber 5, a processing chamber 6, a post-processing chamber 7 and a vacuum conveyor robot 10.

The atmospheric conveyor robot 9, which has extensible arms 91 and is capable of moving vertically and horizontally, puts wafer sheets 8 in and out of the cassette 12 one after another so as to convey the wafer 8 from the cassette 12 of the loader 2 to the wafer 8 orientation flat mate 11, from the wafer 8 orientation flat mate 11 up to the load lock chamber 4, and further between the unload lock chamber 5 and the cassette 12.

The vacuum conveyor robot 10 has extensible arms 101 and conveys the wafer 8 from the load lock chamber 4 up to the processing chamber 6, and from the processing chamber 6 to the post-processing chamber 7 and to the unload lock chamber 5. Moreover, the vacuum conveyor robot 10 is installed so that the turning locus of its extensible arms 101 may be the configuration of all points satisfying the specified geometric conditions of the processing chamber 6, the unload lock chamber 5 and the post-processing chamber 7 while connecting the load lock chamber 4 and the processing chamber 6.

The wafer cassette 12 installed in the loader 2 includes cassettes 12A, 12B for product wafers and a dummy cassette 12C. The cassettes 12 are provided with wafer search mechanisms 121 (A, B, C), 122 (A, B, C) and when the cassettes 12 are set, the wafer search mechanisms 121 recognize specimens therein, respectively.

The load lock chambers 4, 5, the processing and post-processing chambers 6, 7 are provided with wafer lifting mechanisms 14A, 14B, respectively. Further, the extensible arms 91, 101 of the respective robots are arranged so that they can transfer the wafer 8. The wafer lifting mechanism 14B of the processing chamber 6 is incorporated in a specimen stage for loading the wafer, the specimen stage being simultaneously used as an electrode. Reference numeral 15 denotes a ring gate for partitioning off the buffer chamber 3 to form the processing chamber 6; 13, a discharge means for etching; and 14, a discharge means for post-processing (ashing).

The processing chamber 6 is used as a plasma etching chamber for subjecting the wafers 8 to plasma processing one after another, for example, and installed in the lower left portion of the vacuum processing unit 1 as illustrated. The load and unload lock chambers 4, 5 are provided opposite to the processing chamber 6 with the vacuum conveyor robot 10 held therebetween, that is, in the right portion of the vacuum processing unit 1 as illustrated. The post-processing chamber 7 is used for postprocessing the etched wafers 8 one after another and provided in the intermediate portion of the vacuum processing unit 1 with respect to the unload lock chamber 5.

As shown in FIG. 3, the buffer chamber 3 is provided with an opening in the thickness direction of a single structure 100 so as to form a space in which the load lock chamber 4, the unload lock chamber 5, the processing chamber 6, the post-processing chamber 7 and the vacuum conveyor robot 10 are installed. With a central opening as a space in which the vacuum conveyor robot 10 is installed, there is formed a channel 102 for conveying specimens by hollowing out the single structure 100 in such a way as to let corresponding openings communicate with each other. As the chamber-to-chamber positional relation is defined accurately thereby, a precision vacuum processing apparatus is thus obtainable. Since the vacuum processing unit 1 and the loader 2 are integrally fitted to the frame 16, it is possible to provide a more accurate vacuum processing apparatus.

In this case, reference numeral 103 denotes a channel for use in conveying specimens in preparation for the additional provision of a second processing chamber and the second processing chamber 35, which is shown by a chain double-dashed line, is coupled to the side wall of the buffer chamber 3. Normally, the channel 103 may be utilized for the inspection of the interior of the vacuum processing unit 1. In other words, the operator is allowed to troubleshoot not only the vacuum conveyor robot 10 without an unnatural working posture because the processing chamber 6, the vacuum conveyor robot 10 and the load lock chamber 4 are arranged in the vicinity of one side end of the vacuum processing unit 1 but also each chamber via the space of the vacuum conveyor robot 10. The maintenance operation is thus facilitated.

A description will subsequently be given of the operation of processing a wafer in the vacuum processing apparatus thus constructed.

First, the atmospheric conveyor robot 9 is moved to a desired cassette 12 and the extensible arms 91 are stretched toward the cassette 12 of the loader. Then the fork of the extensible arms 91 is inserted under a wafer 8 in the cassette and the atmospheric conveyor robot 9 is slightly lifted to transfer the wafer 8 onto the fork. Subsequently, the atmospheric conveyor robot 9 is moved to the front of the orientation flat mate 11 and the extensible arms 91 are moved onto the orientation flat mate 11 and further the atmospheric conveyor robot 9 is slightly lowered to transfer the wafer 8 onto the orientation flat mate 11. While the wafer 8 is fitted in with the orientation flat mate 11, the extensible arms 91 are returned to a standby position. When fitting the wafer 8 in with the orientation flat mate 11 is completed, the operation of the atmospheric conveyor robot 9 is reversed so as to transfer the wafer 8 onto the fork of the atmospheric conveyor robot 9. Then a loading member 34 is forced by the wafer lifting mechanism 14 to airtightly contact the bottom of the load lock chamber 4 to form a load lock chamber and while the gate valve 33 of the load lock chamber 4 is kept open, the extensible arms 91 of the atmospheric conveyor robot are moved into the load lock chamber 4, whereby the wafer 8 is carried in. The atmospheric conveyor robot 9 is then slightly lowered to transfer the wafer 8 onto the loading member 34. The extensible arms 91 are then returned to the standby position and the gate valve 33 is closed. After the load lock chamber 4 is evacuated, the loading member 34 is lowered by operating the wafer lifting mechanism 14. The extensible arms 101 of the vacuum conveyor robot 10 are moved beneath the wafer 8 on the loading member 34, which is then slightly lowered by operating the wafer lifting mechanism 14, and the wafer 8 is delivered onto the fork of the extensible arms 101. By moving its extensible arms 101, the vacuum conveyor robot 10 conveys the wafer 8 via the channel 102 in the buffer chamber 3 up to the processing chamber 6. In its reverse operation, moreover, the vacuum conveyor robot 10 conveys the wafer 8 up to the cassette position on the unloading side of the loader 2. When the post-processing is needed in this case, the wafer 8 is conveyed by the extensible arms 101 of the vacuum conveyor robot 10 via the post-processing chamber 7. The wafer 8 that has been etched is subjected to plasma post-processing in the post-processing chamber 7.

On the assumption that, for example, wafers 8 are respectively present in the load lock chamber 4, the processing chamber 6 and the post-processing chamber 7, excepting the unload lock chamber 5, the locus of the extensible arms 101 of the vacuum conveyor robot 10 is plotted as follows: that is, the arms 101 of the vacuum conveyor robot 10 first move the wafer 8 in the post-processing chamber 7 to the unload lock chamber 5, transfers the wafer 8 in the processing chamber 6 to the post-processing chamber 7 and then conveys the wafer 8 in the load lock chamber 4 to the processing chamber 6. The extensible arms 101 will repeat such a locus thereafter. As shown in FIG. 3, the center $O_4$ of revolution of the arms of the vacuum conveyor robot 10 is located in such a way that it is shifted to either left or right side of a line XX which connects a position C intermediate between (the center $O_1$ of) the load lock chamber 4 and (the center $O_2$ of) the unload lock chamber 5, and the center $O_3$ of the processing chamber; that is, to the side end of the vacuum processing unit 1. With this arrangement, the range $\theta$ of revolution of the arms of the vacuum conveyor robot 10 (see FIG. 3) comes to about half a round of the circumference; namely 190° according to the embodiment of the present invention. By setting the revolution of the arms of the vacuum conveyor robot 10 substantially within the semicircular range, the vacuum conveyor robot 10 is capable of conveying one sheet of wafer 8 to each of the load lock chamber 4, unload lock chamber 5, processing chamber 6 and post-processing chamber 7 with a circular movement equivalent to not greater than about half a round of the circumference. Since the range of revolution of the arms of the vacuum conveyor robot 10 is set substantially within the semicircular range, the range of revolution of the arms of the vacuum conveyor robot 10 becomes narrow, thus cutting down the tact time.

With reference to the arrangement above, the outer diameter of the processing chamber 6 is greater than those of the other chambers such as load lock chamber 4, the unload lock chamber 5 and the post-processing chamber 7. The processing chamber 6 is placed closer to one side of the vacuum processing unit 1, whereas the other chambers and the vacuum conveyor robot 10 are disposed with two of them set parallel to each other, so that these chambers together with the vacuum conveyor robot 10 may be arranged properly in a predetermined space.

When the processing chamber is of such a type that it is equipped with a microwave generator with a magnetic field, moreover, the size of the apparatus tends to become large to the extent that the microwave generator is added. Even when such a large processing chamber is employed with the arrangement above, however, the remaining chambers can properly be disposed and the vacuum processing unit 1 can also be made compact as these components have been disposed with two of them set parallel to each other.

A description will subsequently be given of a plasma processing apparatus to be installed in the processing chamber 6 of the vacuum processing unit.

Figure 4A:
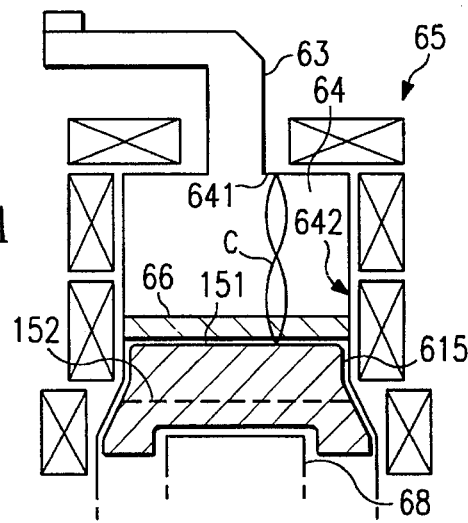
FIG. 4A is vertical sectional view of yet a further embodiment of the invention.

FIG. 4 is a plasma processing apparatus embodying the present invention. An alternative embodiment to that of FIG. 4 is seen in FIG. 4A, where like parts are seen having like numbers. FIG. 5 is a detail view of the gas introducing portion of FIG. 4 and FIG. 6 an enlarged view of the plasma generating unit thereof. The present embodiment refers to a case where microwaves and a magnetic field are utilized as a means for generating a plasma by way of example. Reference numeral 61 denotes a magnetron for generating microwaves; 62 a rectangular waveguide for propagating microwaves; 63 a circle-rectangle conversion waveguide; 64 a cylindrical cavity; 641, the top of the cylindrical cavity 64; 65 solenoid coils for generating a magnetic field; 66 a microwave penetrating window (e.g., a flat quartz plate); 67 a vacuum vessel; 68 a specimen stage for loading a wafer as a specimen; 69 a drive mechanism for vertically moving the specimen stage; 610 a radio-frequency power source for applying a radio-frequency bias voltage to the specimen stage at the time plasma processing, for example, etching; 611 a shower plate for introducing a processing gas, for example, an etching gas into the vacuum vessel 67; 111 gas nozzles provided in the shower plate 611; 112 a gas introducing channel; 612 a variable valve for regulating the pressure in the vacuum vessel; 613 a turbo molecular pump for reducing the pressure in the vessel 67; 614 a vacuum pump for rough evacuation.

A lower vessel 31 is fitted to the lower part of the buffer chamber 3 and is equipped with the specimen stage 68 as what corresponds to the opening of the buffer chamber 3 and the variable valve 612 in its mid portion. The turbo molecular pump 613 is fitted to the end portion of the lower vessel 31 and the vacuum pump 614 for rough evacuation is coupled to the turbo molecular pump 613.

The specimen stage 68 is provided with the drive mechanism 69, so that the upper portion of the specimen stage is made vertically movable. The radio-frequency power source 610 is connected to the specimen stage 68 so as to apply the radio-frequency bias voltage to the specimen stage 68.

The cylindrical vacuum vessel 67 is fitted to the upper part of the buffer chamber 3 and the flat platelike microwave penetrating window 66 is airtightly fitted in the upper opening of the vacuum vessel 67, a plasma generating chamber being formed with the vacuum vessel 67 and the microwave penetrating window 66. A cylindrical wall 642 which has a diameter substantially equal to that of the vacuum vessel 67 and is electrically connected to the vacuum vessel 67 surrounds the microwave penetrating window 66. The top plate 641 having a central circular opening is fitted in the upper opening of the cylindrical wall 642 and electrically connected to the cylindrical wall 642. The cylindrical cavity 64 enclosed with the microwave penetrating window 66, the cylindrical wall 642 and the top plate 641 is thus provided. The circle-rectangle conversion waveguide 63 is coupled to the central circular opening of the top plate 641 and electrically connected thereto. Further, the waveguide 62 and the magnetron 61 are successively electrically coupled to the circle-rectangle conversion waveguide 63.

The ring gate 15 is provided as a cylindrical gate valve for separating the processing chamber 6 from the channel 102 as a specimen conveying space in the buffer chamber 3. The ring gate 15 is so formed as to have a diameter substantially equal to that of the inner diameter of the vacuum vessel 67, incorporated from under the buffer chamber 3 and vertically driven by two air cylinders arrange symmetrically about the central axis of the ring gate 15.

The solenoid coil 65 is provided on the outer periphery of the vacuum vessel 67 as well as the cylindrical cavity 64. The solenoid coil 65 includes solenoid coils 652, 653 wound on the outer peripheral portions of the cylindrical cavity 64 and the vacuum vessel 67, and a solenoid coil 651 located on the top plate 641 of the cylindrical cavity 64, the latter having not only a smaller inner diameter but also a greater number of turns in the circumferential direction. The solenoid coil 651 is used for generating the main magnetic flux, whereas the solenoid coils 652, 653 are used for controlling the magnetic lines of force. Further, a yoke 654 on the outer periphery of the solenoid coils 651, 652, 653 is used for enclosing these coils. The inner upper end portion of the yoke 654 as what corresponds to the solenoid coil 651 is concentric with the cylindrical cavity 64 and the vacuum vessel 67, and bent down toward the cylindrical cavity 64.

The shower plate 611 having a number of gas nozzles 111 is provided under the microwave penetrating window 66 with a very small gap left therebetween and the gas introducing channel 112 is made to communicate with the gap between the microwave penetrating window 66 and the shower plate 611.

Figure 6:
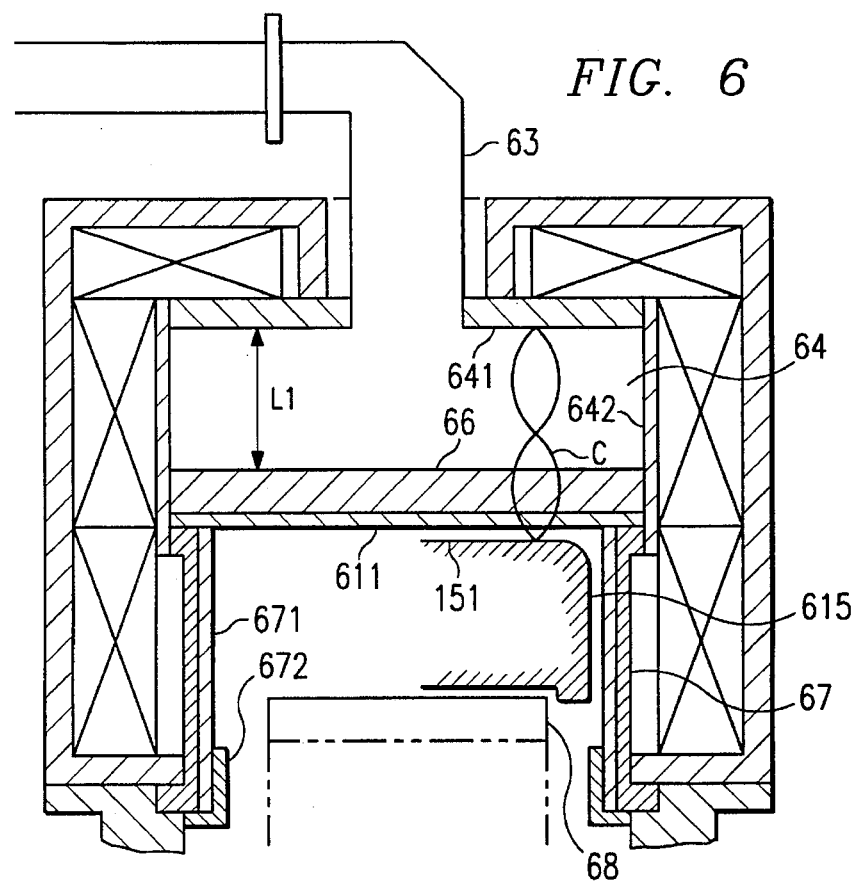
FIG. 6 is an enlarged view of the plasma generating member of the apparatus of FIG. 4.

As shown in FIG. 6, the inner face of the vacuum vessel 67 is lined with a cylindrical insulating cover 671 made of plasma-resistant material such as quartz and ceramics in order to render the vacuum vessel 67 free from the contamination of metal. Moreover, an earth electrode 672 as a ground potential member is fitted to the inside of the vacuum vessel 67 in the vicinity of the specimen stage 68 in the form of an electrode. The earth electrode 672 is electrically connected to the buffer chamber 3 set at the ground potential and bent inward to form a groove with the vacuum vessel 67. The insulating cover 671 in this case is fitted into and held in the groove formed between the inner wall surface of the vacuum vessel 67 and the earth electrode 672. The insulating cover 672 is made not less than 5 mm thick in consideration of its strength and maintenance period. The earth electrode 672 allows conduction to exist between the vacuum vessel 67 electrically insulated by the insulating cover 672 and a plasma 615.

In order to avoid the contamination of metal, the inner surface of the vacuum vessel 67 may otherwise be covered with a plasma-resistant insulating material (e.g., quartz, $Al_2F_3$, mullite, $Cr_2O_3$) or a semiconductor (e.g., SiC). When radio-frequency bias power is applied to the specimen stage 68 for processing purposes, the plasma-resistant insulating material should preferably be set not greater than 1 mm thick to make the earth effect readily achievable.

With the apparatus thus constructed, the vacuum vessel 67 is first evacuated by the turbo molecular pump 613 and the vacuum pump 614 in order to generate the plasma in the vacuum vessel 67. When a specimen is processed, the processing gas is introduced from the gas introducing channel 112 in between the microwave penetrating window 66 and the shower plate 611 and thence to the vacuum vessel 67 from the gas nozzles 111 provided in the shower plate 611. Incidentally, the same effect will be achievable even though the gas nozzles are provided in the periphery of the undersurface of the microwave penetrating window 66 without using the shower plate 611.

Subsequently, the microwave which possesses a frequency of 2.45 GHz in this case and is oscillated from the magnetron 61 is guided into the cylindrical cavity 64 along the rectangular waveguide 62 and the circle-rectangle conversion waveguide 63. In this case, microwaves in a rectangular $TE_{10}$ mode are propagated through the waveguide 62 and these microwaves are converted by the circle-rectangle conversion waveguide 63 to those in a circular $TE_{11}$ mode, before being introduced into the cylindrical cavity 64. The microwave thus introduced into the cylindrical cavity 64 is then guided into the vacuum vessel 67 via the microwave penetrating window 66 and the shower plate 611. In the meantime, the solenoid coils 65 installed around the vacuum vessel 67 cause an axial magnetic field to be formed in the vacuum vessel 67. Due to the microwaves introduced into the vacuum vessel 67 and the action of the magnetic field deriving from the solenoid coils 65, electrons in the plasma make a gyrating movement on receiving the Lorentz power from the magnetic field. When the period of the gyrating movement substantially conforms to the frequency of the microwave, the electrons receive energy from the microwaves with efficiency and produce a high-density plasma 615 deriving from the Electron Cyclotron Resonance phenomenon (hereinafter called the "ECR"). The apparatus according to the present invention is designed to make an equal magnetic field interface (hereinafter called the "ECR interface") meeting the requirements for causing the ECR exist in the vacuum vessel 67. In this case, the strength of the magnetic field on the ECR interface is 875 gauss. A high-density plasma 615 is thus generated in the vacuum vessel 67. FIG. 4 shows an ECR interface 152 by a broken line. The ECR interface is so controlled and regulated by the solenoid coil 651 for the main magnetic flux and the control solenoid coils 652, 653 that it may be set at a desired level in the vacuum vessel 67. According to the present embodiment of the invention, the solenoid coils 65 are fastened together by the yoke 654, which has been drawn up to the inner peripheral portion of the solenoid coil 651, whereby it is easy concentrating the magnetic field formed in the solenoid coils 65 in the axial direction, flattening the ECR interface by means of the control solenoid coils 652, 653, and controlling the level of the ECR interface. Although the upper edge portion of the yoke 654 in this case is to be folded back axially so as to concentrate the magnetic field in the axial direction with greater efficiency, the intended purposed can be accomplished without taking the trouble to fold back the upper edge portion thereof axially.

FIG. 6 shows the behavior of the microwave introduced into the cylindrical cavity 64. The microwave introduced into the cylindrical cavity 64 first becomes a standing wave which repeats reflection with the specimen stage 68 as a reflective end after being introduced via the cylindrical cavity 64 and the microwave penetrating window 66 into the vacuum vessel 67 or what repeats reflection between the top plate 641 of the cylindrical cavity 64 and the upper or lower face of the microwave penetrating window 66 or the shower plate 611. During this time of reflection, the processing gas in the vacuum vessel 67 is excited by the microwaves introduced into the vacuum vessel 67 and converted into a plasma. When the density of the plasma thus generated exceeds a certain level (in a case where a magnetic field is present, electron density $>1\times10^{11}/cm^3$), some of the microwaves incident on the plasma are reflected in the plasma portion having that density. In the case of a discharge using the ECR, the plasma density readily rises up to a level at which the microwave is reflected. For this reason, some of the microwaves are reflected with the plasma portion 615 having that density as a boundary plane 151 and such a microwave becomes a standing wave c after repeating reflection between the top plate 641 of the cylindrical cavity 64 and the boundary plane 151 of the plasma 615. When the density of the plasma thus generated exceeds a certain level (in a case where a magnetic field is present, electron density $>1\times10^{11}/cm^3$), the standing wave c becomes dominant.

A description will subsequently be given of the above fact. Although the boundary plane 151 of the plasm actually has a certain thickness, the thickness of the boundary plane 151 will be bypassed for the sake of explaining the principle only. When the distance from the top plate 641 of the cylindrical cavity 64 up to the boundary plane 151 of the plasma 615 (equivalent distance with respect to the microwave: $L=\int\sqrt{\epsilon r}dx$ (integration of (0, 1), $\epsilon r$=dielectric constant, is used) comes to integer times ½ of guide wavelength in a certain mode, this mode produces resonance, which can exist as a standing wave between the top plate 641 of the cylindrical cavity 64 and the boundary plane of the plasma 615. A microwave newly introduced from the circle-rectangle conversion waveguide 63 into the cylindrical cavity 64 is superimposed on the standing wave, whereby a microwave equal in the mode of guide wavelength to the standing wave resonates therewith and becomes what has a more intense electromagnetic field. The mode which is unable to satisfy the condition above attenuates and fails to exist between the top plate 641 of the cylindrical cavity 64 and the boundary plane 151 of the plasma 615.

By properly selecting the height of the cylindrical cavity 64, the resonance-intensified microwaves in a specific single mode or a plurality of specific modes can thus be introduced into the vacuum vessel 67 via the microwave penetrating window 66 and the shower plate 611 while the mode in the cylindrical cavity 64 is maintained. In other words, a uniform stable, high-density plasma can be generated as no arbitrary mode-to-mode transition is allowed to occur after the plasma is generated.

In this case, microwaves in the $TE_{11}$ mode are introduced from the circle-rectangle conversion waveguide 63 into the cylindrical cavity 64. Since the microwaves in the $TE_{11}$ mode are to be introduced into the cylindrical cavity 64, though microwaves in various modes TE, TM may be present in the cylindrical cavity 64 having an enlarged inner diameter, the mode TE is basically easy to occur. Such a mode TE as is inducible includes $TE_{11}$, $TE_{21}$, $TE_{01}$, $TE_{31}$, $TE_{41}$, $TE_{12}$, $TE_{51}$, $TE_{22}$, $TE_{02}$, $TE_{61}$. As microwaves to be introduced into the cylindrical cavity 64 in this case are the microwaves in the mode $TE_{11}$, a propagation ratio is high in the mode $TE_{11}$. The internal dimensions of the cylindrical cavity 64 are set so that the standing wave c in the mode $TE_{01}$ can be formed, whereby microwaves mainly in the modes $TE_{11}$, $TE_{01}$ are propagated through the cylindrical cavity 64. With respect to microwaves in other modes than those mentioned above, some of them are reflected from the boundary plane 151 of the plasma 615 due to a phase shift and gradually attenuate while they are offset by newly introduced microwaves. The microwaves in the mode $TE_{11}$ provide a strong electromagnetic field in the central portion, whereas those in the more $TE_{01}$ make a strong electromagnetic field in the peripheral portion. Consequently, by superimposing the microwaves in the two modes, microwaves having not only a strong electromagnetic field but also a uniform electromagnetic field strength can be propagated over a wide range of the interior of the cylindrical cavity 64. A uniform, stable high-density plasma can thus be generated in the vacuum vessel 67.

Since the inner diameters of the cylindrical cavity 64 and the vacuum vessel 67 are set equal at this time, a serious error in the inner diameter of the space ranging from the top plate 641 of the cylindrical cavity 64 up to the boundary plane 151 of the plasma 615 is obviated and microwaves propagating in the cylindrical cavity 64 can directly be transmitted to the vacuum vessel 67. It is therefore preferred for the cylindrical cavity 64 and the vacuum vessel 67 to be basically equal in inner diameter. Notwithstanding, the inner diameter of the vacuum vessel 67 is set slightly smaller under certain design restrictions as to, for example, the fitting of the microwave penetrating window 66. Incidentally, the reason for setting the inner diameter of the vacuum vessel 67 slightly smaller than that of the cylindrical cavity 64 is attributed to the way of fitting the shower plate 611 and the microwave penetrating window 66. Since the cylindrical cavity 64 and the vacuum vessel 67 are respectively situated on the atmospheric and negative pressure sides in particular, the microwave penetrating window 66 is pressed against the upper end portion of the vacuum vessel 67 by making use of the difference in pressure so as to keep the interior of the vacuum vessel 67 airtight.

Although the inner diameter of the vacuum vessel 67 is set equal in the axial direction according to the present embodiment of the invention, the inner diameter of the lower part of the vacuum vessel may be varied gradually with the same effect achievable as set forth above as long as the boundary plane 151 of the plasma 615 is at least set equal in diameter to the cylindrical cavity 64 as shown in FIG. 4A. In this case, the inner diameter is gradually increased up to the specimen carrier 68 where it is sized as required. In this manner, the cylindrical cavity may be reduced in size and the whole body including the solenoid coils 65 may be made compact.

Referring to FIGS. 7 through 14 inclusive, plasma performance of the aforementioned apparatus will subsequently be described.

In order to examine the plasma performance of the apparatus according to the present invention, the diameter of the cylindrical cavity 64 is set at 405 mm and the height thereof is rendered variable from 0 to 160 mm. Moreover, the diameter of the microwave penetrating window 66 is set at 404 mm; the diameter of the vacuum vessel 67 at 350 mm; and the distance between the undersurface of the microwave penetrating window 66 and the top of the specimen stage 68 at 175 min.

Any plasma performance tendency to be described below is not restricted to the dimensions of the aforementioned apparatus according to the present invention. When a specimen is processed by means of a microwave plasma, the microwave penetrating window is set substantially perpendicular to the direction in which the microwave advances and the microwaves are caused to penetrate into substantially the whole of the vacuum vessel before being introduced via the cylindrical cavity into the vacuum vessel whose diameter is substantially equal to that of the cylindrical cavity. In this way, the dimensions of the aforementioned apparatus are set free from any restriction.

Figure 7:
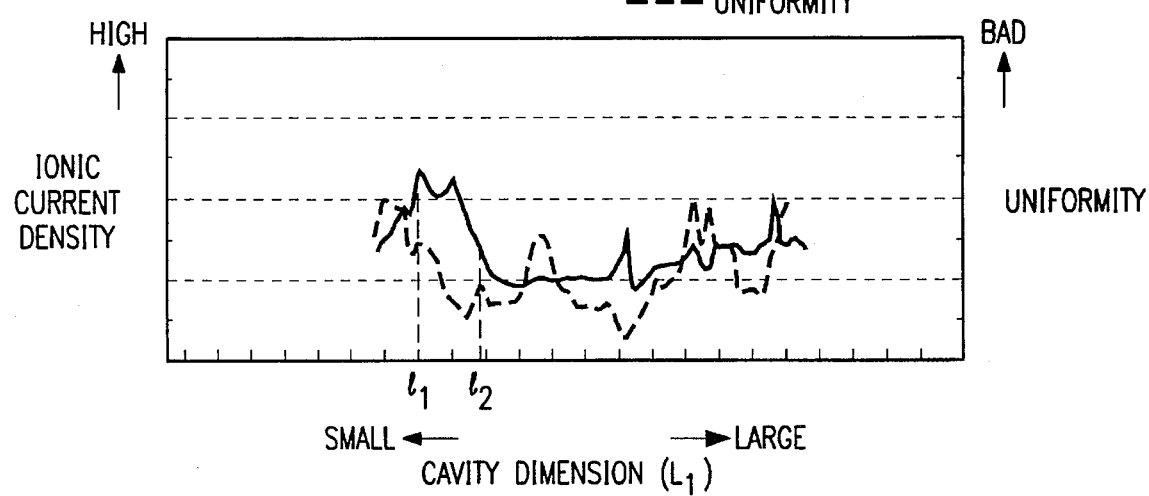
FIG. 7 is a graphical representation showing the level and uniformity of the density of an ionic current reaching a workpiece when the dimensions (L1) of the cylindrical cavity in the apparatus of FIG. 4 are varied.
Figure 8:
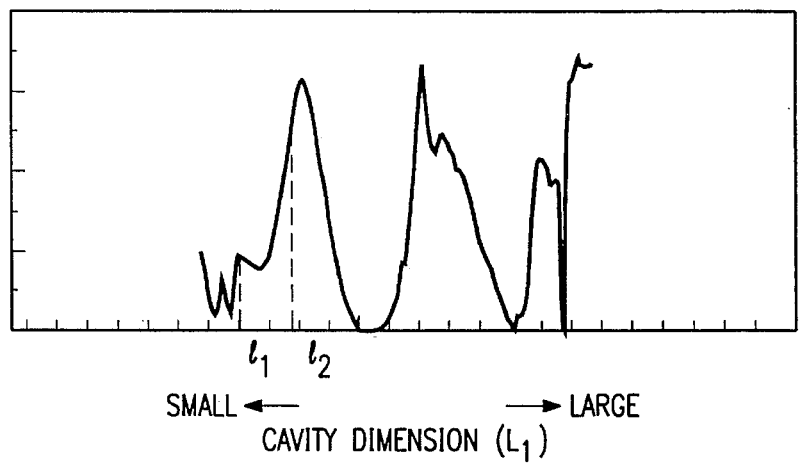
FIG. 8 is a graphical representation showing a reflected microwave when the dimensions (L1) of the cavity in the apparatus of FIG. 4 are varied.

FIG. 7 shows the level and uniformity of the density of an ionic current reaching a specimen when the height (L) of the cylindrical cavity 64 is varied and FIG. 8 the behavior of a reflected microwave then. As shown in FIGS. 7 and 8, the level and uniformity of the saturated ionic current density and the reflected microwave are seen to vary when the height (L) of the cylindrical cavity 64 is changed. The application of the dimensional (L) conditions (in the range of $1_1$–$1_2$) of the cylindrical cavity where the saturated ionic current density is high and fairly uniform to FIG. 8 reveals the fact that the conditions under which the reflected wave becomes 0 and maximized remain unsatisfied but the portion intermediate between both conditions, that is, the condition under which the wave is reflected to a certain extent is met. The reflected wave at this time is what is reflected back via the waveguides 63, 62. The dimensional (L) conditions (in the range of $1_1$–$1_2$) of the cylindrical cavity where the saturated ionic current density is high and fairly uniform are not satisfied at the peak values of the saturated ionic current density and uniformity but set in a substantially wide range and also an allowable range. When the dimensions (in the range of $1_1$–$1_2$) of the cylindrical cavity allow microwaves to be reflected to a certain degree, the microwave is considered to be in the plurality of specific modes rather than the single mode. However, the microwave may be input to the plasma effectively even when the reflected wave is great with the dimension (L) of the cylindrical cavity by providing a matching means such as a stab tuner in the waveguide 62 or the circle-rectangle conversion waveguide 63.

Figure 9:
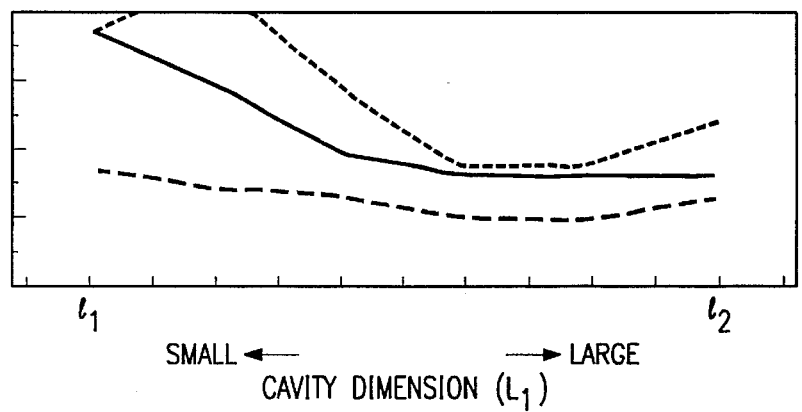
FIG. 9 is a graphical representation showing the relation between the dimensions (L1) of the cavity and the uniformity of the ionic current density when the distance (L2) between a flat quartz plate for use in introducing microwaves and an ECR interface in the apparatus of FIG. 4 is varied.
Figure 10:
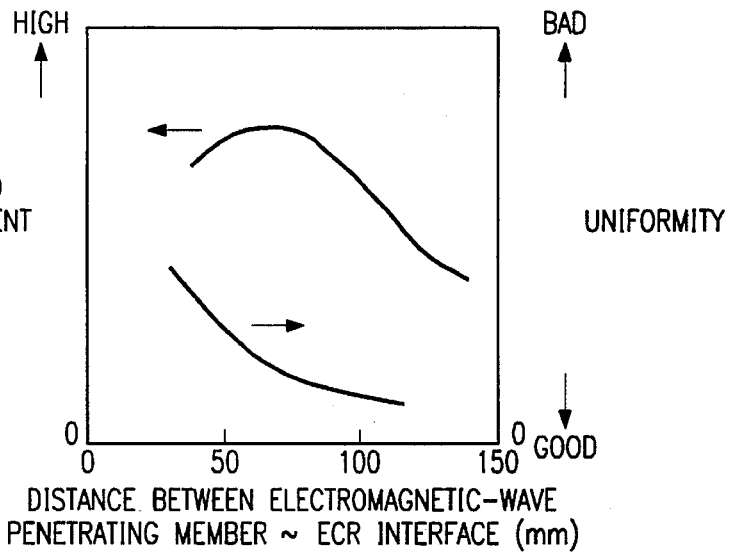
FIG. 10 is a graphical representation showing the level and uniformity of the ionic current reaching the workpiece when the distance (L2) between the flat quartz plate for use in introducing microwaves and the ECR interface in the apparatus of FIG. 4 is varied.

FIG. 9 shows the relation between the dimension (L1) of the cylindrical cavity and the uniformity of the ionic current density when the distance (L2) between the microwave penetrating window 66 and the ECR interface is varied. FIG. 10 depicts another version of FIG. 9 when the tendency therein is viewed from a different angle, showing the level and uniformity of the density of the saturated ionic current reaching the specimen when the distance between the microwave penetrating window 66 and the ECR interface is varied on the assumption that the distance between the ECR interface and the specimen stage 68 for loading a specimen is constant. Apparently, the uniformity of the distribution of the saturated ionic current density is seen to improve as the distance (L2) between the microwave penetrating window 66 and the ECR interface increases. In order to set the uniformity of the saturated ionic current density at not greater than 10%, a distance of not less than 50 mm proved to be necessary between the microwave penetrating window 66 and the ECR interface according to another experiment.

Figure 11:
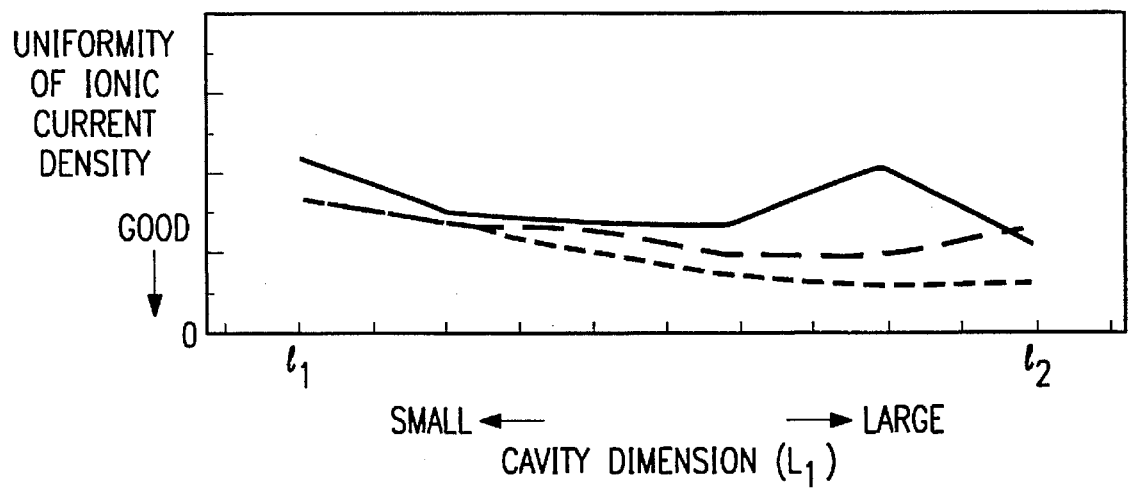
FIG. 11 is a graphical representation showing the relation between the dimensions (L1) of the cavity and the uniformity of the ionic current density when the distance (L3) between the ECR interface and a specimen stage for loading the workpiece in the apparatus of FIG. 4 is varied.
Figure 12:
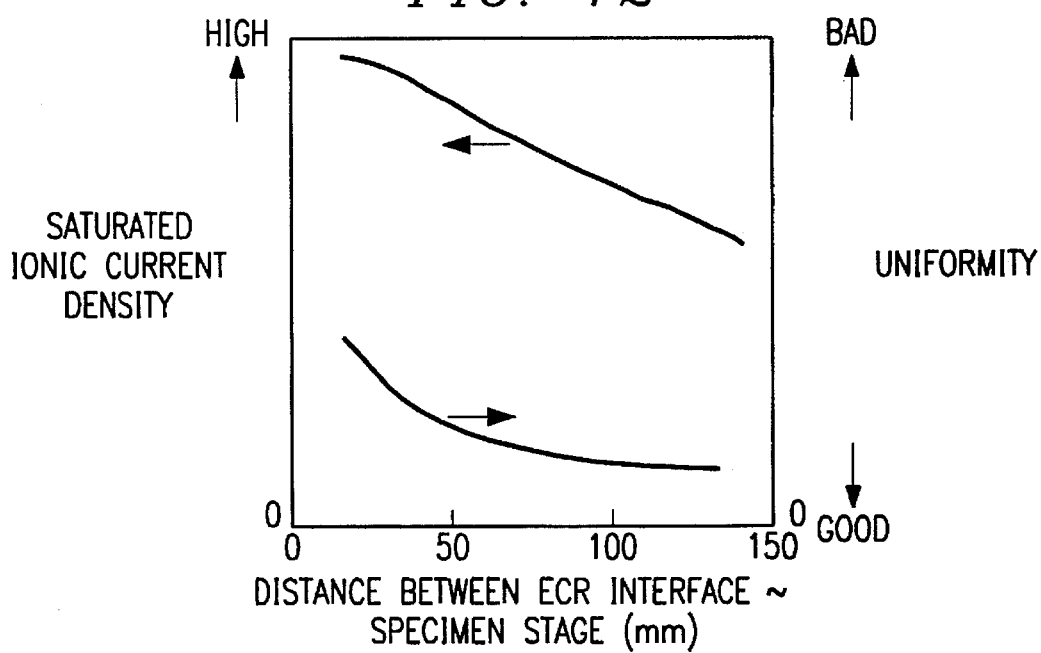
FIG. 12 is a graphical representation showing the level and uniformity of the ionic current reaching the workpiece when the distance (L3) between the ECR interface and a specimen stage for loading the workpiece in the apparatus of FIG. 4 is varied.

FIG. 11 shows the relation between the dimension (L1) of the cylindrical cavity and the uniformity of the ionic current density when the distance (L3) between the ECR interface and the specimen stage for loading a specimen. FIG. 12 depicts another version of FIG. 9 when the tendency therein is viewed from a different angle, showing the level and uniformity of the density of the saturated ionic current reaching the specimen when the distance between the ECR interface and the specimen stage 68 for loading a specimen is varied on the assumption that the distance between the microwave penetrating window 66 and the ECR interface is constant. Apparently, the uniformity of the distribution of the saturated ionic current density is seen to improve as the distance between the ECR interface and the specimen stage 68 for loading a specimen increases. Since the uniformity sharply worsens when the distance between the ECR interface and the specimen stage 68 for loading a specimen is decreased to less than 30 mm according to still another experiment, a distance of not less than 30 mm proved to be necessary between the ECR interface and the specimen stage 68 for loading a specimen so as set the uniformity of the saturated ionic current density at not greater than 10%.

Figure 13A:
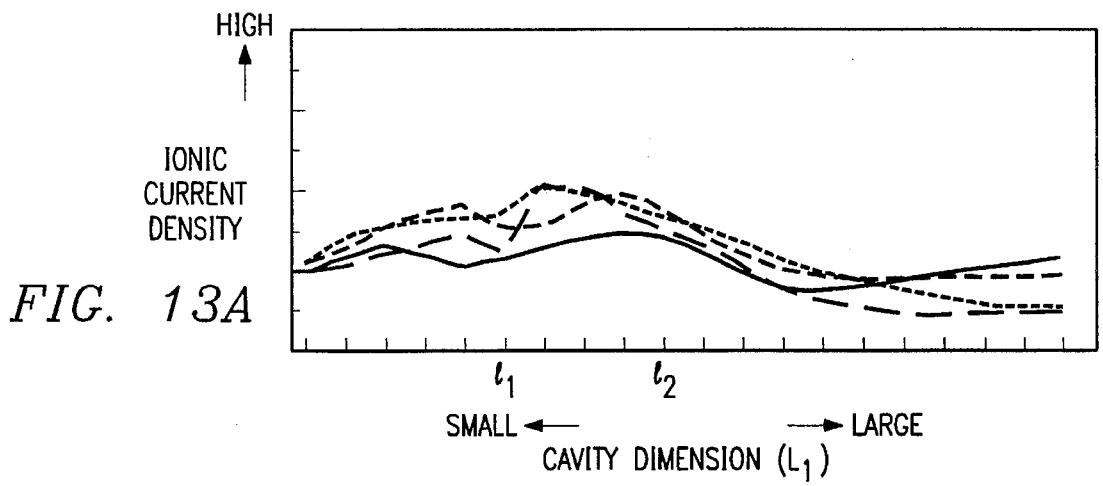
FIG. 13 (A–C) shows the dimensions (L1) of the cavity, the level of the density of the ionic current reaching the workpiece, the uniformity of the ionic current density, and discharge stability when a magnetic field gradient in the apparatus of FIG. 4 is varied: (13A) shows the level of the ionic current density; (13B) the uniformity of the ionic current density; and (13C) the discharge stability.
Figure 13B:
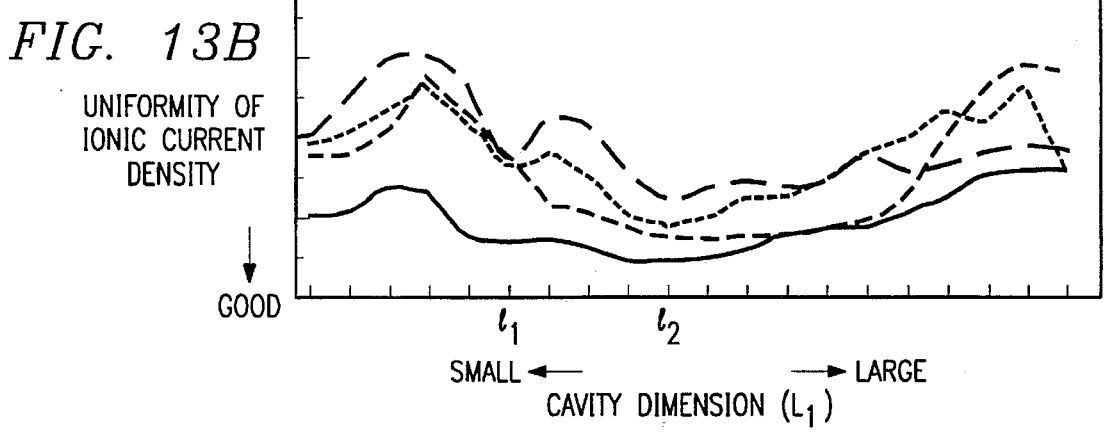
Figure 13C:
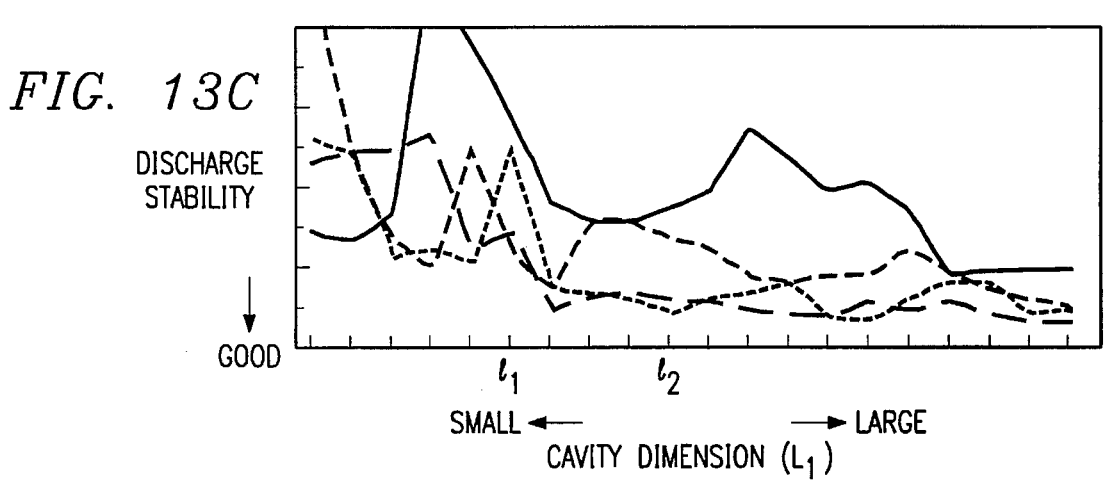
Figure 14:
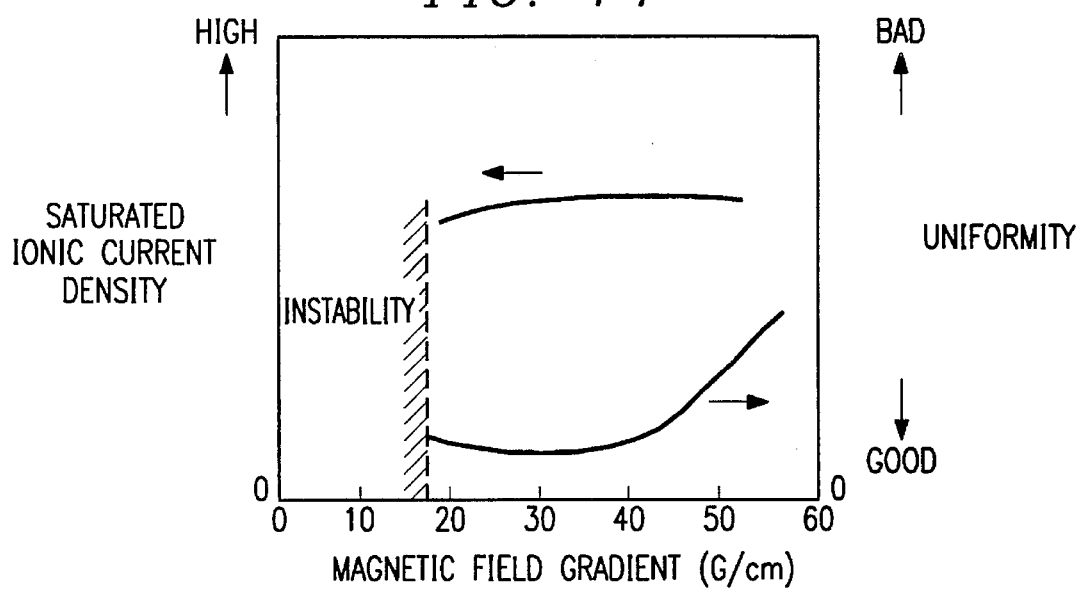
FIG. 14 is a graphical representation showing the level and uniformity of the ionic current reaching the workpiece when the magnetic field gradient in the apparatus of FIG. 4 is varied.

FIG. 13 shows the level, uniformity and discharge stability of the density of the ionic current reaching the specimen when a magnetic field gradient is varied. In this case, FIG. 13(a) shows the level of the ionic current density; 13(b) the uniformity of the ionic current density; and 13(c) the discharge stability of the ionic current density. FIG. 14 depicts another version of FIG. 13 when the tendency therein is viewed from a different angle, showing the level and uniformity of the density of the saturated ionic current reaching the specimen when the magnetic field gradient at the center of the ECR interface is varied. There is little difference in discharge stability among cases where the setting of the magnetic field gradient is changed to 50 G/cm, 40 G/cm and 30 G/cm. However, the discharge tends to become unstable when such a value is set at 20 G/cm. According to another experiment, the discharge was found unstable when the magnetic field gradient was set at not greater than 15 G/cm. As shown in FIG. 14, there is little difference among the mean values of the saturated ionic current density in specimens when the value of the magnetic field gradient increases but the uniformity tends to become poor. As set forth above, it is effective to set the value of the magnetic field gradient at the center of the ECR interface in the range of 20 G/cm to 50 G/cm so as to obtain a stable uniform, high-density plasma. In order to obtain a further uniform plasma, an equal magnetic field plane satisfying the condition of causing ECR will have to be a substantially flat plane with respect to the processing surface of the specimen.

As shown in FIG. 4, the magnetic field strength on the central axial line of the vacuum vessel 67 can readily be increased by making the inner diameter of the upper solenoid coil 651 for the main magnetic flux or the diameter (Dy) of the yoke 654 smaller than the diameter of the specimen or the microwave penetrating window 66. Moreover, by controlling the control solenoid coils 652, 653 together with the magnetic flux of the solenoid coil 651, a flat magnetic field can also readily be obtained within the plane in parallel to the surface of the specimen at a magnetic field gradient of not less than 20 G/cm and not greater than 50 G/cm. In order to control the magnetic field as mentioned above, the solenoid coil 651 for the main magnetic flux and the control solenoid coils 652, 653 are disposed continuously without a large gap, respectively. With respect to the diameter of the vacuum vessel 67, a uniformity of not greater than 10% was proved possible on condition that the diameter thereof was set at not less than +50 mm with respect to the diameter of the specimen.

In the apparatus thus constructed, the radio-frequency power source 610 connected to the specimen stage 68 controls energy incident on ions in the plasma directed to the specimen loaded on the specimen stage 68 separately from the generation of the plasma. The values of the currents flowing through the solenoid coils 651, 652 and 653 are so controlled by a power controller (not shown) as to vary the intensity of the magnetic field gradient, whereby it is possible to not only make flat the resonance magnetic field distribution (on the ECR interface) as the ECR condition of the magnetic field caused to be generated in the discharge space but also move the position of the plasma from the specimen-loading surface in the vacuum vessel 67 as a plasma processing chamber.

When the position of the plasma from the specimen-loading surface is varied through the steps of employing an oxide film as a primary material for a specimen, Al alloy as a workpiece and photoresist as a mask material, supplying 150 sccm of $BCl_3+Cl_2$ as an etching gas, holding processing pressure at 12 m Torr, setting microwave power at about 1,000 W and setting radio-frequency power at 85 W so as to control currents flowing through the solenoid coils 651, 652 and 653, the etching speed of the mask and primary materials is increased as the position of the plasma from the specimen is gradually set away from the specimen while the etching speed of the workpiece as the specimen remains substantially unchanged. Moreover, the Vpp value produced at the specimen stage increases as the position of the plasma is gradually set away from the specimen. In other words, not only the bias voltage but also the incident energy of ions in the plasma increases and the etching residue tends to decrease.

The workpiece of Al alloy is set as high as no residue is produced by the plasma at the time of etching the Al alloy, that is, the height of the plasma from the specimen-loading surface is reduced and set as high as a selection ratio with respect to the primary material is high, that is, the height of the plasma from the specimen-loading surface is increased. The intended purpose is thus accomplished.

When the oxide film ($SiO_2$) as a primary material, together with the TiN or TiW film coated with an Al alloy film, and with the photoresist as a mask material, is employed for the workpiece, etching free from the residue is carried out by setting the position of the plasma closer to the workpiece during the etching of the Al alloy film, using $BCl_3+Cl_2$ or $BCl_3+SF_6$ as an etching gas, and etching at a high mask-to-primary material selection ratio is carried out by setting away the position of the plasma during the etching of the TiN or TiW film. Although the position of the plasma is set closer to the specimen during the etching of the Al alloy film and it is set away therefrom during the etching of the TiN or TiW film, this case is not restrictive as the positional condition of the plasma varies with, for example, the mixture ratio and pressure of the etching gas.

In reference to the cases above where the workpiece is made of Al alloy and where it is the laminated film prepared by coating the TiN or TiW film with the Al alloy film, any other effective etching condition may be found by grasping etching characteristics regarding each material of the workpiece even when it is made of materials other than those enumerated above.

Although the position of the plasma has been made variable by controlling the magnetic field by means of the solenoid coils 65, the same effect may be achieved by moving the specimen stage 68 so as to change the distance between the specimen stage 68 and the plasma.

In this way, the apparatus according to the present invention allows the magnetic field formed by the solenoid coils 65 to be controlled in a wide range covering the height and configuration of the ECR interface, the magnetic flux density gradient and so forth. Since the setting of the height of the specimen stage 68 as an electrode can be recipe-based, for example, to make the current density of ions incident on a specimen controllable by regulating the height of the specimen stage 68, the ion current density can be changed on a material basis and consequently optimum plasma processing such as etching fit for a specific material becomes feasible.

In the apparatus thus constructed, the turbo molecular pump 613 is used as the main pump and the exhaust channel is enlarged, so that high-velocity exhaust is possible. Incidentally, the exhaust velocity of the turbo molecular pump 613 is 2,000 l/s and the effective exhaust velocity of the specimen-loading portion of the specimen stage 68 is about 900 l/s (in terms of $N_2$). With respect to the high-velocity exhaust, Japanese Patent Laid-Open No. 259119/1993 describes the effectiveness of such a high-velocity exhaust. According to this idea, while a plasma density is kept high with a low pressure being maintained at high exhaust velocity against etchant supply rate-determining in the case of polysilicon etching, a reaction gas is sufficiently supplied so as to increase silicon etching velocity.

In this case, it is possible to raise a selection ratio by keeping the ion accelerating energy low to decrease the primary material etching velocity. However, form controllability (i.e., to obtain vertical work-shaping faithful to a mask material is difficult because the density of a reaction product is lowered under the condition which relies on such a high-velocity exhaust and some means for improving the form controllability is necessitated. Consequently, a specimen is cooled and then etched after oxygen is added to chlorine gas as an etchant.

Therefore, an etching velocity higher than what is acquired at the time of processing the specimen kept at room temperature is acquired by simultaneously keeping the specimen at low temperatures (the specimen temperature at not higher than 0° C.) in a smaller $O_2/Cl_2+O_2$: (not greater than 1.5%) region of oxygen loadings than before under the high-velocity exhaust condition (gas flow rate: not less than 250 ml/min). Productivity can thus be improved further.

The reason for this is that, in the conventional etching apparatus, the plasma density is insufficient, which often results in following the energy rate-determining step and the etchant supply rate-determining step as the exhaust performance is unsatisfactory, and the silicon etching velocity has not necessarily been increased. Whereas a high etching velocity seems to have been attained according to the present invention by causing a greater amount of etchant than before to stick to the surface of silicon and optimizing chemical reaction equilibrium with the addition of oxygen by maintaining a high-density plasma, implementing high-velocity exhaust and simultaneously keeping a specimen at low temperatures. With respect to the silicon oxide film, on the other hand, the reaction is known to be suppressed only in such an extremely low temperature region that the specimen temperature is lower than −100° C. and the effect of suppression based on low-temperature processing is considered unapplicable to etching velocity. It is considered rather predominant to suppress chemical etching (e.g., Si—O recombination) by overdosing oxygen onto the surface of the oxide film.

In addition, the configuration of the processing chamber or the etching chamber in this case is simplified by making the inner diameter of the vacuum processing apparatus 67 substantially equal to that of ring gate 15, and the vacuum vessel 67, the ring gate 15 and the specimen stage 68 are set concentric. Since the apparatus employs the high-velocity exhaust, deposits such as reaction products are hardly allowed to stick to the processing chamber as its inner face is free from ruggedness and the reaction products resulting from plasma processing are prevented from accumulating as the gas flows uniformly and smoothly. In other words, the apparatus can be rendered what is substantially free from variation with time. Moreover, the uniformity of processing performance is made improvable as the gas flow is also uniformized.

Figure 15:
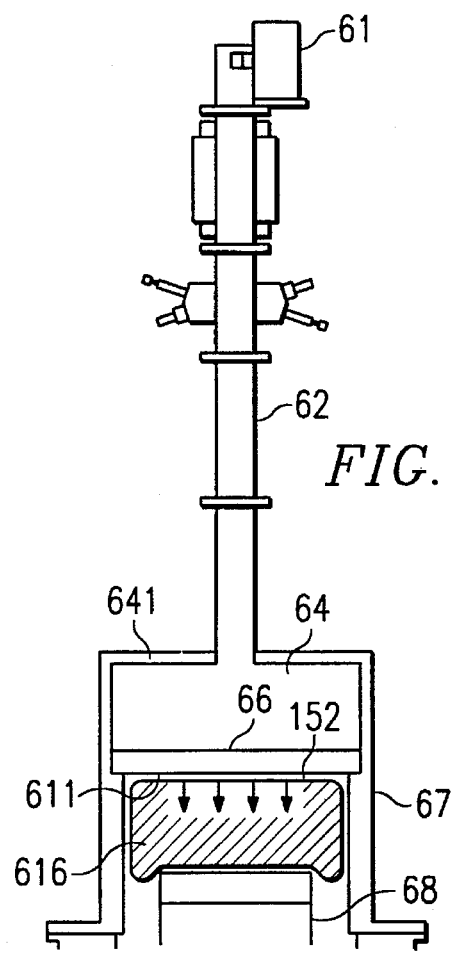
FIG. 15 is a vertical sectional view of another plasma processing apparatus embodying the present invention.
Figure 16:
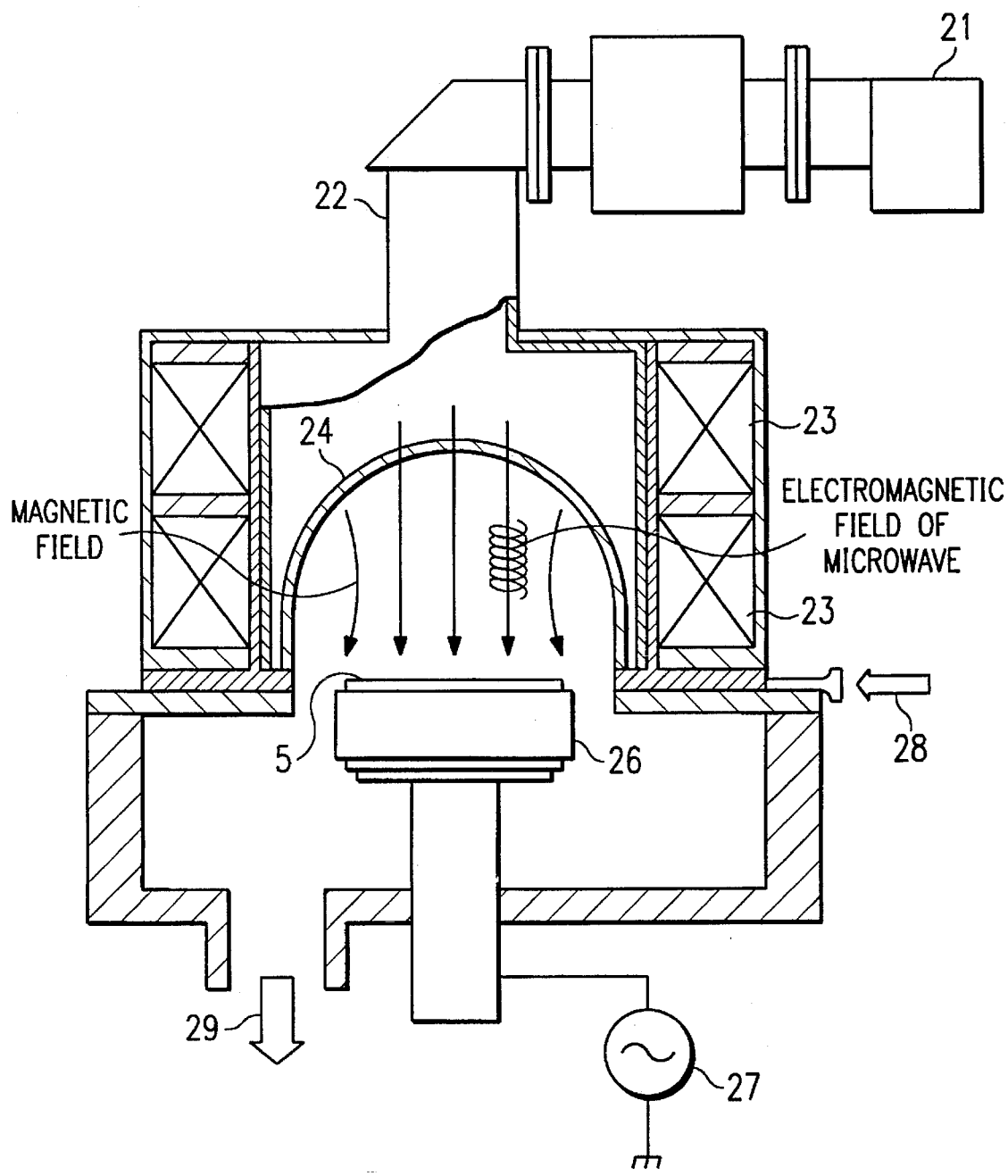
FIG. 16 is a block diagram of a conventional microwave plasma etching apparatus.

Referring to FIG. 15, there is shown therein another plasma processing apparatus embodying the present invention as what uses only microwaves as means for generating a plasma. In FIG. 15, like reference characters designate like members of FIG. 4 and not only the description thereof but also the illustration of components common to both will be omitted.

The apparatus according to the present embodiment is different from the preceding embodiment in that it is not equipped with solenoid coils for generating a magnetic field in the vacuum vessel 67 and only microwaves are introduced via the cylindrical cavity 64 into the vacuum vessel 67 in order to convert a process gas in the vacuum vessel to a plasma.

Since no magnetic field exists in this apparatus, some of the microwaves are reflected when an electron density exceeds $7 \times 10^{10}/cm^3$. However, like the apparatus according to the preceding embodiment, the reflection end of the microwave coincides with the boundary plane 152 of the plasma 616, any action other then physical phenomena deriving from the magnetic field are similar to those according to the preceding embodiment.

As set forth above, according to these embodiments, the microwave penetrating window 66 which has a diameter substantially equal to the inner diameter of the vacuum vessel 67 is provided in the microwave introducing member of the vacuum vessel 67 as a plasma generating chamber. The cylindrical cavity 64 as a cavity which has a diameter substantially equal to the inner diameter of the vacuum vessel 67 is for use in resonating microwaves in specific modes on a microwave reflective interface with the plasma generated in the vacuum vessel 67 and is set adjacent to the vacuum vessel 67 via the microwave penetrating window. The microwaves are introduced via the cylindrical cavity 64 into the discharge space in the vacuum vessel 67, whereby the plasma is generated in the vacuum vessel 67 by the microwaves introduced via the cylindrical cavity 64 into the vacuum vessel 67. As the generation of the plasma takes place, the microwaves from the cylindrical cavity 64 without being absorbed by the plasma are reflected from the microwave reflective interface with the plasma. The microwave thus reflected is again reflected from the top plate 641 as the reflective edge face of the cylindrical cavity 64 and becomes a standing wave, which undergoes the repetition of reflection between the microwave reflective interface with the plasma and the reflective edge face of the cylindrical cavity 64 and which is superimposed on a newly-incident microwave. The resonance state is thus created, whereby microwaves in the specific modes are formed in the cylindrical cavity 64 and the high energy of the microwaves in the specific modes is applied to the plasma so as to densify the plasma. Since the cylindrical cavity 64 is set substantially equal in diameter to the discharge space, moreover, the microwaves are resonated on the whole, substantially equivalent cylindrical-cavity 64-to-plasma reflective surface and the microwaves in the specific modes can directly be transmitted to the plasma. Consequently, a plasma excellent in uniformity can be generated with stability by resonating the microwaves in the specific modes simultaneously with a uniform electromagnetic field.

A still higher-density plasma can be generated by letting the magnetic field deriving from the solenoid coils act on the generation of the plasma in contact with the microwaves to utilize ECR.

Moreover, the vacuum vessel 67 as a chamber for processing specimens is made cylindrical so that the axial sectional area at any given point may be equalized and even though the position of the ECR interface is varied in the axial direction within the vacuum vessel 67, the area of the ECR interface will remain unchanged, whereby the plasma at any given position in the axial direction within the vacuum vessel 67 is densified and uniformized. In other words, the state of the plasma is made invariable at any given position.

Moreover, the distance of the space between the ECR interface as a space where the energy of microwaves is transmitted to the plasma and the microwave penetrating window 66 formed with the flat quartz plate for introducing the microwaves is set at not less than 50 mm, whereby the plasma thus generated is uniformized. Further, the distance between the ECR interface as a space where the plasma thus generated is expanded by diffusion and the specimen stage for loading a specimen as a workpiece is set at not less than 30 mm, whereby the plasma reaching the specimen loaded on the specimen stage is uniformized because of the effect of diffusion. The ionic current density can thus be distributed uniformly at not greater than 10%.

Further, the position of the ECR interface is prevented from sharply fluctuating as the current caused to flow through the solenoid coils for generating the magnetic field slightly fluctuates by setting the value of the magnetic field gradient on the ECR interface at not less than 20 G/cm. By also setting the value of the magnetic field gradient on the ECR interface in the range of not greater than 50 G/cm, the thickness of the ECR interface is prevented from decreasing and since the distribution of intensity of the microwaves is prevented from directly reflecting on the plasma density, the plasma reaching the specimen loaded on the specimen stage is also prevented from becoming variable, so that the deterioration of the uniformity of the saturated ionic current density is suppressed.

With those features stated above, the density of the ionic current supplied to the processing surface of the work piece can be distributed with a uniformity of not greater than 10% to ensure that large-diameter specimens such as 8-inch wafers are uniformly etched.

Since the provision of the insulating cover on the inner wall surface of the vacuum vessel 67 according to the embodiments above prevents the contamination of metal because of the plasma in the vacuum vessel, microwaves exhibiting uniform energy distribution are used for generating a uniform plasma and simultaneously large-diameter specimens such as 8-inch wafers become processable uniformly at an excellent yield rate.

Although microwaves (e.g., 2.45 GHz) are used to describe the embodiments above, the present invention is not necessarily limited to the microwaves but has the same effect achieved provided electromagnetic waves are used for generating a plasma.

What is claimed is:
1. A plasma generating method comprising the step of:
transmitting microwaves into a first cavity;
resonating transmitted microwaves in the first cavity, whereby a standing wave is defined between a reflection interface of a plasma and a microwave reflective opposite-to-plasma face of the first cavity.

2. A plasma generating method as claimed in claim 1, further comprising causing a magnetic field to act on the generation of the plasma by means of the microwaves.

3. A method as in claim 1, wherein said resonating the microwaves comprises resonating in specific modes between the microwave reflective face of the cavity and the plasma generated in the discharge space.

4. A method as in claim 3, wherein said reflective interface of the plasma is substantially equal in diameter to the cavity diameter.

5. A method as in claim 1, further comprising:
introducing microwaves via a cavity into a discharge space,
converting a gas in the discharge space into a plasma by means of the microwaves introduced into the discharge space, and
wherein said resonating comprises resonating the microwaves in specific modes in between a microwave reflective interface of plasma generated in the discharge space substantially equal in diameter to the cavity and the reflective edge face of the cavity.

6. A method as in claim 5, wherein the specific mode comprises $TE_{11}$.

7. A method as in claim 5, wherein the specific mode comprises $TE_{01}$.

8. A plasma generating method as claimed in claim 5, further including the step of causing a magnetic field to act on the generation of the plasma by means of the microwaves.

9. A plasma generating method as claimed in claim 8, further comprising:
supplying plasma generating gas into the discharge space from a microwave penetrating member located between the discharge space and the cavity,
causing a magnetic field to act on the generation of the plasma by means of the microwaves, such that electron cyclotron resonance develops.

10. A plasma generating method as claimed in claim 8, wherein the specific modes of the microwaves are $TE_{11}$ and $TE_{01}$ modes.

11. A plasma generating apparatus comprising:
a plasma generating chamber;
a microwave penetrating window, whose diameter is substantially equal to an inner diameter of said plasma generating chamber; and
a cavity, whose diameter is substantially equal to said inner diameter of said plasma generating chamber, said cavity being in microwave communication with the plasma generating chamber via the microwave penetrating window.

12. An apparatus as in claim 11, wherein said cavity is positioned to resonate microwaves in specific modes with a microwave reflective interface of a plasma to be generated in the plasma generating chamber.

13. A plasma generating apparatus as claimed in claim 12, further including solenoid coils provided around said plasma generating chamber and said cavity.

14. A plasma generating apparatus as claimed in claim 13, further comprising:

a gas supply positioned to supply gas into said plasma generating chamber, wherein the microwaves and the magnetic field derived from the solenoid coils are set to cause electron cyclotron resonance.

15. A plasma generating apparatus as in claim 14, wherein the distance between an ECR interface by the electron cyclotron resonance and said microwave penetrating window is at least about 50 mm.

16. A plasma generating apparatus as claimed in claim 12, wherein the specific modes of the microwaves are $TE_{11}$ and $TE_{01}$ modes.

17. A plasma generating apparatus as in claim 11, wherein said cavity comprises an enlarged edge face at a first end coupled to the other end of the waveguide, wherein said plasma generating chamber is substantially cylindrical having a diameter substantially equal to that of the cylindrical cavity coupled to the other open end of the cylindrical cavity, and further comprising:

a waveguide for propagating microwaves generated from a microwave oscillator fitted to one end of the waveguide, a flat plate microwave penetrating window which has a diameter substantially equal to the diameters of the cylindrical cavity and the plasma generating chamber and is provided at the joint between the cylindrical cavity and the plasma generating chamber, a specimen stage provided in the plasma generating chamber facing the microwave penetrating window, processing gas supply input positioned to supply a processing gas to the vicinity of the microwave penetrating window in the direction of the plasma generating chamber, and an evacuation port positioned to effectively vacuumize the plasma generating chamber.

18. A plasma processing apparatus as claimed in claim 17, further comprising coils positioned to form a magnetic field capable of causing an ECR action in the plasma generating chamber, one of the inner diameters of the coil and a yoke outside the coils being smaller than the diameter of the microwave penetrating window.

19. A plasma processing apparatus as claimed in claim 17, wherein the distance between the microwave penetrating window and the ECR interface is set at not less than 50 mm.

20. A plasma processing apparatus as claimed in claim 17, wherein the distance between the ECR interface and the specimen stage is set at not less than 30 mm.

21. A plasma processing apparatus as claimed in claim 17, wherein the value of a magnetic field gradient on the ECR interface is set in the range of 20 G/cm to 50 G/cm.

22. A plasma processing apparatus as claimed in claim 17, further comprising gas nozzles positioned to send jets of gas into the plasma generating chamber, the gas nozzles being provided in the vicinity of the microwave penetrating window and scattered in parallel to the specimen stage.

23. A plasma processing apparatus as claimed in claim 17, wherein the specimen stage and the plasma generating chamber are arranged concentrically, the specimen stage 68 being adjustable to any given position on the central axial line.

24. A plasma processing apparatus as in claim 11, further comprising:

a microwave introducing member for introducing microwaves into the apparatus, a vacuum vessel which communicates with said cavity and is for use in forming a discharge region, and a microwave penetrating window between the cavity and the vacuum vessel, which forms a part of the vacuum vessel, and which causes the energy of the microwaves to penetrate into substantially the whole of the vacuum vessel, wherein the diameter of the effective penetrating portion of the microwave penetrating window is substantially equal to the inner diameter of the vacuum vessel and made not less than 1.75 times the diameter of a workpiece, wherein microwaves are caused to repeat reflection among the microwave penetrating member, the interface of the discharge region, and the edge face on the microwave introducing side of the cavity, so as to form a standing wave in a $TE_{01}$ mode, and wherein the resulting standing wave is superimposed on what has been transmitted from the microwave introducing member and the mixture is introduced into the discharge region.

25. A plasma processing apparatus as in claim 11, further comprising a cylindrical vessel which has an inner diameter large enough to load a large-diameter wafer of not less than 8 inches and is made of conductive material allowing microwaves to be transmitted therethrough is partitioned with a discoidal microwave penetrating window, wherein one side of the cylindrical vessel is kept in a vacuum atmosphere, whereas the other side thereof is connected to a microwave waveguide, and wherein the face of the microwave penetrating window on its vacuum atmospheric side is set substantially close to a position away from the edge face of the cylindrical vessel with a microwave waveguide connected thereto by not greater than n/2 times the guide wavelength of the microwave.

26. A plasma processing apparatus as claimed in claim 25, wherein the inner diameter of the cylindrical vessel is not less than 350 mm and wherein the microwave waveguide is used for propagating microwaves in a circular $TE_{11}$ mode.

27. A plasma processing apparatus as claimed in claim 25, wherein magnetic field means are provided on the outer peripheries of the microwave waveguide and the cylindrical vessels.

28. A plasma processing apparatus as claimed in claim 25, wherein the inner diameter of the vacuum atmospheric side of the cylindrical vessel is smaller than that of the microwave penetrating member to the extent of a tab for fitting the microwave penetrating member.

29. A specimen plasma processing method comprising:

supplying a processing gas to a plasma generating chamber, vacuumizing the plasma generating chamber up to a pressure level, introducing oscillated microwaves into a cylindrical cavity, introducing the microwaves propagating through the cylindrical cavity directly into the plasma generating chamber, converting the processing gas in the plasma generating chamber to a plasma by means of the microwaves introduced in to the plasma generating chamber, reflecting the microwaves that have not been absorbed by the plasma in specific modes in between the plasma generated in the plasma generating chamber and the other edge face of the cylindrical cavity opposite to the plasma generating chamber, and processing a specimen by means of the plasma in the plasma generating chamber.

30. A plasma processing method as claimed in claim 29, further comprising causing the microwaves in the cylindrical cavity to penetrate into substantially the whole of the plasma generating chamber.

31. A plasma processing method as claimed in claim 29, wherein the plasma utilizes the ECR action by the microwaves and the magnetic field.

32. A plasma processing method as claimed in claim 29, further comprising adjusting the ECR interface to a given relative position in agreement with the material of the specimen.

33. A plasma processing method as in claim 29, wherein said specimen comprises a workpiece in a vacuum vessel, and wherein said introducing the microwaves propagating through the cylindrical cavity directly into the plasma generating chamber comprises transmitting the microwaves in specific modes to the microwave introducing member, and further comprising:

causing the microwave to repeat reflection between a discharge region interface with a microwave penetrating member and the edge face on the introducing side of the cavity so as to form a standing wave in a first specific mode, mixing the standing wave with the microwave propagated through the microwave introducing member, said propagated microwave having a second mode different from the first specific mode, and introducing the mixture into a discharge region, thus causing a discharge in the vacuum vessel.

34. A plasma processing method as claimed in claim 33, further comprising:

making the specific mode transmitted to the microwave introducing member a $TE_{11}$ mode, making the first specific mode for forming the standing wave a $TE_{01}$ mode, and making the second specific mode transmitted through the microwave introducing member a $TE_{11}$ mode.

35. A specimen plasma processing apparatus comprising:

means for supplying a processing gas to a plasma generating chamber, means for vacuumizing the plasma generating chamber up to a pressure level, means for introducing oscillated microwaves into a cylindrical cavity, means for introducing the microwaves propagating through the cylindrical cavity directly into the plasma generating chamber, means for converting the processing gas in the plasma generating chamber to a plasma by means of the microwaves introduced into the plasma generating chamber, means for reflecting the microwaves that have not been absorbed by the plasma in specific modes in between the plasma generated in the plasma generating chamber and the other edge face of the cylindrical cavity opposite to the plasma generating chamber, and means for processing a specimen by means of the plasma in the plasma generating chamber.

36. A plasma processing apparatus as claimed in claim 35, further comprising means for causing the microwaves in the cylindrical cavity to penetrate into substantially the whole of the plasma generating chamber.

37. A plasma processing apparatus as claimed in claim 35, wherein the plasma utilizes the ECR action by the microwaves and the magnetic field.

38. A plasma processing apparatus as claimed in claim 35, further comprising adjusting the ECR interface to a given relative position in agreement with the material of the specimen.

39. A plasma processing apparatus as in claim 35, wherein said specimen comprises a workpiece in a vacuum vessel, and wherein said means for introducing the microwaves propagating through the cylindrical cavity directly into the plasma generating chamber comprises means for transmitting the microwaves in specific modes to the microwave introducing member, and further comprising:

means for causing the microwave to repeat reflection between a discharge region interface with a microwave penetrating member and the edge face on the introducing side of the cavity so as to form a standing wave in a first specific mode, means for mixing the standing wave with the microwave propagated through the microwave introducing member, said propagated microwave having a second mode different from the first specific mode, and means for introducing the mixture into a discharge region, thus causing a discharge in the vacuum vessel.

40. A plasma processing apparatus as claimed in claim 39, further comprising means for making the specific mode transmitted to the microwave introducing member a $TE_{11}$ mode, means for making the first specific mode for forming the standing wave a $TE_{01}$ mode, and means for making the second specific mode transmitted through the microwave introducing member a $TE_{11}$ mode.

41. A plasma generating method comprising the step of:

introducing microwaves via a cavity having a reflective edge face into a discharge space, the discharge space being substantially equal in diameter to the cavity, converting a gas in the discharge space into a plasma by means of the microwaves introduced into the discharge space, resonating transmitted microwaves in the cavity, whereby a standing wave is defined between a microwave reflection interface of the plasma and a microwave reflective opposite-to-plasma face of the cavity, and wherein said resonating comprises resonating the microwaves in specific modes between the microwave reflective interface and the reflective face of the cavity.

42. A method as in claim 41, wherein the specific mode comprises $TE_{11}$.

43. A method as in claim 41, wherein the specific mode comprises $TE_{01}$.

44. A plasma generating method as claimed in claim 41, further including the step of causing a magnetic field to act on the generation of the plasma by means of the microwaves.

45. A plasma generating method as claimed in claim 44, further comprising:

supplying a plasma generating gas into the discharge space from a microwave penetrating member located between the discharge space and the cavity, causing a magnetic field to act on the generation of the plasma by means of the microwaves, such that electron cyclotron resonance develops.

46. A plasma generating method as claimed in claim 44, wherein the specific modes of the microwaves are $TE_{11}$ and $TE_{01}$ modes.

47. A plasma processing apparatus comprising:

a cylindrical vessel having an inner diameter large enough to load a large-diameter wafer of not less than 8 inches, said cylindrical vessel comprising conductive material allowing microwaves to be transmitted therethrough, partitioned with a discoidal microwave penetrating window, being substantially equal to an inner diameter of said plasma generating chamber, and having defined therein:

a cylindrical plasma generating chamber on a first side of the window, and a cavity on a second side of the window, whose diameter is substantially equal to the inner diameter of the plasma generating chamber, said cavity being:

kept in a vacuum, in microwave communication with the plasma generating chamber via the microwave penetrating window on a first side of the cavity, and connected to a microwave waveguide on a second side of the cavity, wherein a face of the microwave penetrating window on its cavity side is set substantially close to a position away from the second side of the cavity by not greater than n/2 times the guide wavelength.

48. A plasma processing apparatus as claimed in claim 47, wherein the inner diameter of the cylindrical chamber is not less than 350 nm and wherein the microwave waveguide is used for propagating microwaves in a circular $TE_{11}$ mode.

49. A plasma processing apparatus as claimed in claim 47, wherein magnetic field means are provided on the outer peripheries of the microwave waveguide and the cylindrical chamber.

50. A plasma processing apparatus as claimed in claim 47, wherein the inner diameter of the cavity side of the cylindrical chamber is smaller than that of the microwave penetrating window to the extent of a tab for fitting the microwave penetrating window.

51. A plasma processing method comprising the steps of:

supplying a processing gas to a plasma generating chamber;

vacuumizing the plasma generating chamber to a pressure level;

introducing oscillated microwaves into a cylindrical cavity, having an edge face;

converting the processing gas in the plasma generating chamber into a plasma by means of the oscillated microwaves introduced into the plasma generating chamber;

reflecting the oscillated microwaves that have not been absorbed by the plasma in specific modes between the plasma generated in the plasma generating chamber and an edge face of the cylindrical cavity opposite the plasma generating chamber;

processing a specimen by means of the plasma in the plasma generating chamber;

introducing the oscillated microwaves in the cylindrical cavity directly into the plasma generating chamber, wherein said introducing comprises transmitting the microwaves in specific modes to a microwave introducing member;

causing the microwave to repeat reflection between a discharge region interface of the plasma and an edge face on an introducing side of the cylindrical cavity so as to form a standing wave in a first specific mode;

mixing the standing wave with the microwave propagated through the microwave introducing member, the propagated microwave having a second mode different from the first specific mode; and introducing the mixture into a discharge region, thus causing a discharge in the vacuum vessel.

52. A plasma processing method as claimed in claim 51, further comprising:

making the specific mode transmitted to the microwave introducing member a $TE_{11}$ mode, making the first specific mode for forming the standing wave a $TE_{01}$ mode, and making the second specific mode transmitted through he microwave introducing member a $TE_{11}$ mode.

* * * * *